United States Patent
Nakagawa et al.

(10) Patent No.: US 7,626,908 B2
(45) Date of Patent: *Dec. 1, 2009

(54) TARGET TRACK SEEKING FOR DATA RECORDING AND REPRODUCING SYSTEM

(75) Inventors: Toshiyuki Nakagawa, Kanagawa (JP); Hiroaki Eto, Kanagawa (JP)

(73) Assignee: Sony Corporation, Tokyo (JP)

( * ) Notice: Subject to any disclaimer, the term of this patent is extended or adjusted under 35 U.S.C. 154(b) by 874 days.

This patent is subject to a terminal disclaimer.

(21) Appl. No.: 11/038,164

(22) Filed: Jan. 21, 2005

(65) Prior Publication Data

US 2005/0204267 A1 Sep. 15, 2005

(30) Foreign Application Priority Data

Feb. 16, 2004 (JP) .............................. 2004-038765

(51) Int. Cl.
*G11B 27/30* (2006.01)

(52) U.S. Cl. .................. 369/59.23; 360/78.04; 714/770
(58) Field of Classification Search ............. 360/78.04, 360/78.14, 77.02, 77.06, 78.01; 369/59.23, 369/30.1–30.17; 714/769, 770, 784
See application file for complete search history.

(56) References Cited

U.S. PATENT DOCUMENTS

| | | | |
|---|---|---|---|
| 6,628,583 B1 * | 9/2003 | Van Den Enden et al. .. | 369/47.1 |
| 7,038,991 B1 * | 5/2006 | Spruit et al. ............. | 369/59.24 |
| 7,188,299 B2 * | 3/2007 | Nakagawa et al. .......... | 714/763 |
| 7,308,637 B2 * | 12/2007 | Nakagawa et al. .......... | 714/758 |
| 7,339,873 B2 * | 3/2008 | Nakagawa ............... | 369/59.23 |

* cited by examiner

*Primary Examiner*—Tan X Dinh
(74) *Attorney, Agent, or Firm*—Oblon, Spivak, McClelland, Maier & Neustadt, L.L.P.

(57) ABSTRACT

An object of the present invention is to record or reproduce time-sequential data to/from recording media exemplified by hard disks at the transfer speed closer to that of the recording medium.

16 Claims, 22 Drawing Sheets

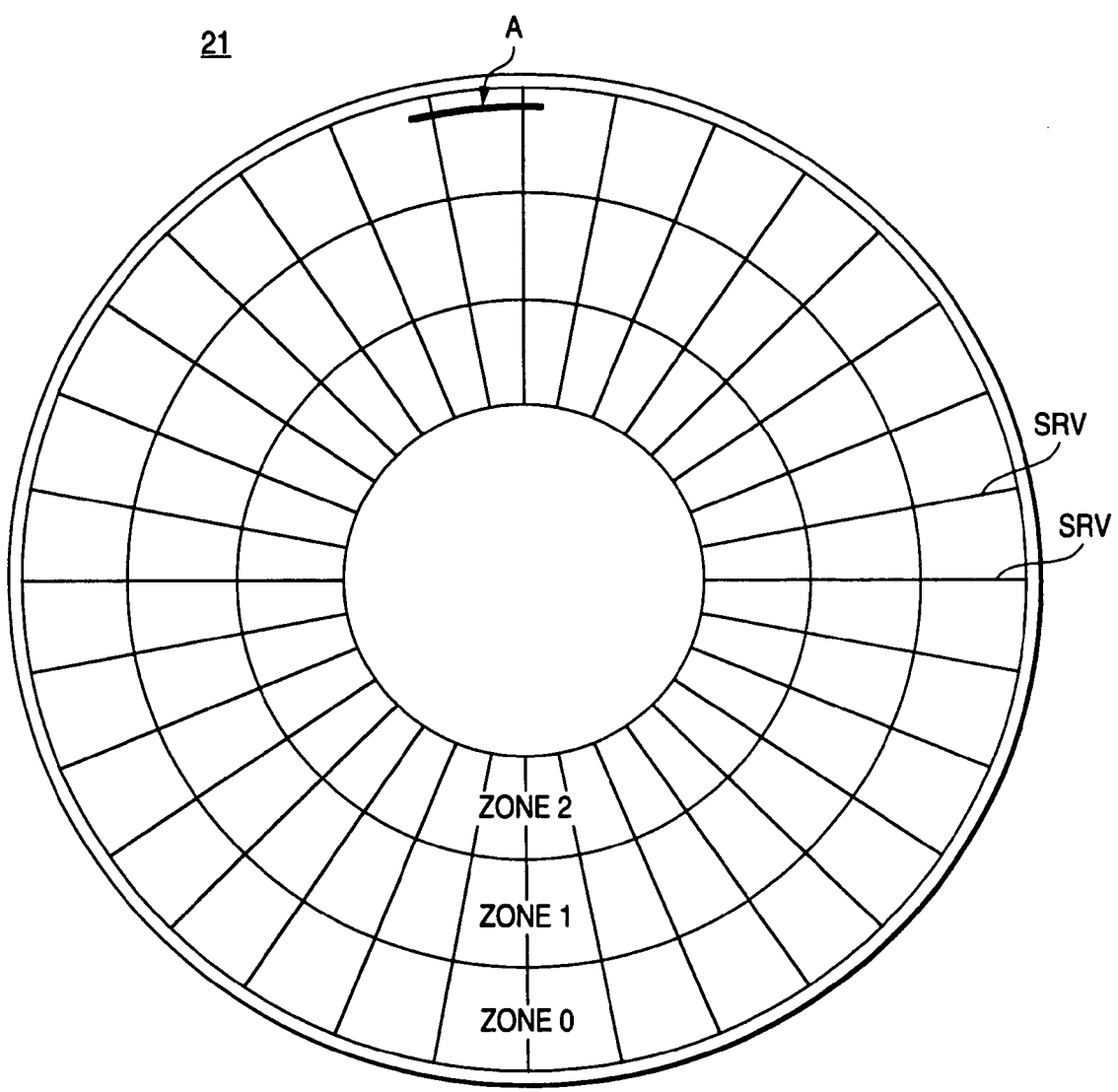

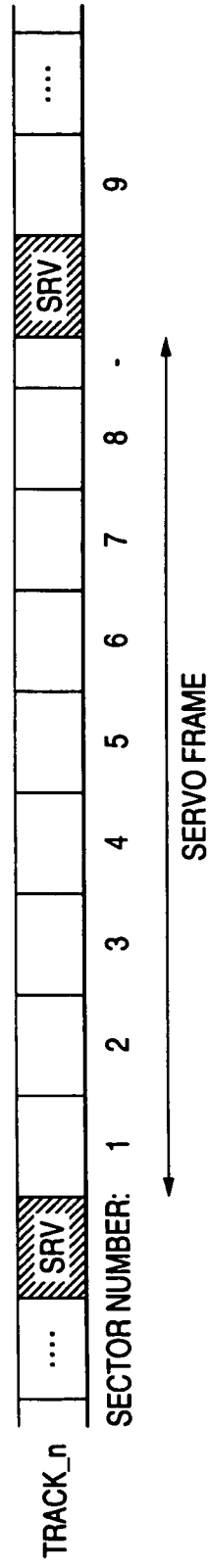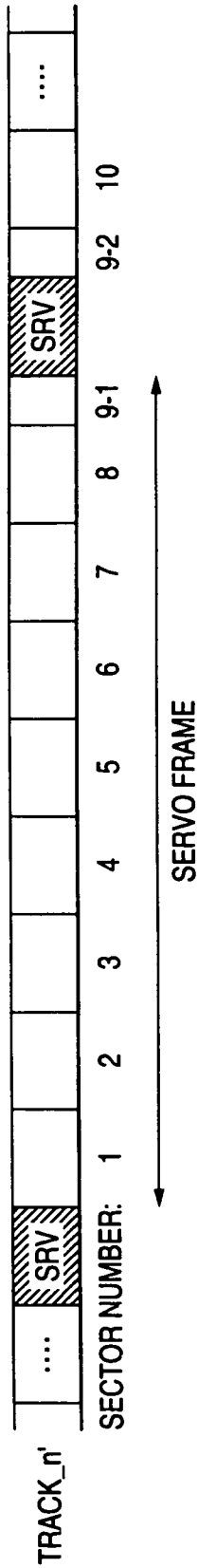

FIG. 7

| CONTENT INFORMATION | TRACK NUMBER | HEAD NUMBER |
|---|---|---|
| 1 | 0-99 | 0 |
| 2 | 100-129 | 0 |
| 3 | 200-249 | 0 |
| 4 | 130-199 | 0 |
| 5 | 300-399 | 0 |
| ⋮ | ⋮ | ⋮ |
| 9 | 470-499 | 0 |
| NOT IN USE | - | - |
| NOT IN USE | - | - |
| NOT IN USE | - | - |
| ⋮ | ⋮ | ⋮ |
| NOT IN USE | 500-999 | 0 |
| NOT IN USE | 0-999 | 1 |

FIG. 11

| 0 | HEADER0 |
|---|---|
| 1 | HEADER1 |
| 2 | HEADER2 |
| 3 | HEADER3 |
| 4 | DATA0 |
| 5 | DATA1 |
| 6 | DATA2 |
| 7 | DATA3 |
| 8 | DATA4 |
| 9 | DATA5 |
| ⋮ | ⋮ |
| 511 | DATA507 |
| 512 | DATA508 |
| 513 | DATA509 |
| 514 | DATA510 |
| 515 | DATA511 |
| 516 | CRC0 |
| 517 | CRC1 |
| 518 | CRC2 |
| 519 | CRC3 |
| 520 | PARITY000 |
| 521 | PARITY100 |
| 522 | PARITY200 |
| 523 | PARITY300 |
| ⋮ | ⋮ |
| 564 | PARITY011 |
| 565 | PARITY111 |
| 566 | PARITY211 |
| 567 | PARITY311 |

FIG. 15

EXEMPLARY TRACK-BASIS SECTOR PLACEMENT WITH LBA

EXEMPLARY TRACK-BASIS SECTOR PLACEMENT WITH LBA

EXEMPLARY TRACK-BASIS SECTOR PLACEMENT WITH LBA

EXEMPLARY TRACK-BASIS SECTOR PLACEMENT WITH LBA

EXEMPLARY TRACK-BASIS SECTOR PLACEMENT NOT WITH LBA BUT WITH RELATIVE ADDRESS

| | |
|---|---|
| ▨ | : C2 SECTOR |
| ━ | : SECTOR AND SERVO FRAME BOUNDARY |
| ─ | : SECTOR BOUNDARY | ns
TARGET TRACK SEEKING FOR DATA RECORDING AND REPRODUCING SYSTEM

FIELD OF THE INVENTION

The present invention relates to data recording/reproducing systems and methods for use with randomly-accessible recording media, computer programs and the recording media, and specifically, relates to a technology for a disk-shaped recording medium that performs data reading and writing while scanning a magnetic head on a magnetic disk which serves as a medium such as a hard disk. More specifically, the present invention relates to a technology that achieves stable data recording and reproduction while shortening the time taken to access any desired data storage location.

BACKGROUND OF THE INVENTION

[Patent Document 1] JP-A-2000-276856
[Patent Document 2] JP-A-2000-278645

As information technology including information processing and information communications becomes more advanced, the need arises for reusing information that has been previously created and edited. Such a need increases to a great degree the significance of the technology used for information storage. Until now, information recorders utilizing various media exemplified by magnetic tapes and magnetic disks have been developed and used widely.

Among such information recorders, HDDs (Hard Disk Drives) are auxiliary storage devices of a magnetic recording system. The drive unit of an HDD houses a plurality of magnetic media each serving as a recording medium, and those magnetic media are motor-driven and rotate at a high speed. The magnetic media are each plated with a magnetic substance including iron oxide and cobalt chromium, or coated with a thin film thereof.

The surfaces of magnetic media are subjected to rotation scanning by the magnetic head in the radius direction. As a result of such scanning, the magnetic media are magnetized to a level equivalent to data so that data writing or reading becomes possible.

The hard disks are already quite popular for use with personal computers as their standard external storage devices. Such hard disks are used to install various types of software needed to activate computers including operating systems (OSs), applications, or others, or to store any created or edited files. The HDD is generally connected to the main unit of a computer through a standard interface exemplified by IDE (Integrated Drive Electronics) or SCSI (Small Computer System Interface). The storage space of the HDD is managed by a file system such as an FAT (File Allocation Table) serving as a sub system for the operating system.

The HDDs have been recently increased in capacity, and such capacity increase is favorably leading to expansion of the range of applications. Not only serving conventionally as auxiliary storage devices for computers, the HDDs are becoming available for storing various contents as hard disk recorders that store any broadcast-received AV contents.

Exemplified here is a case of using a hard disk as an auxiliary storage device for a computer to discuss the physical format or the data reading/writing operation of the hard disk.

The hard disk is formed with, concentrically, a plurality of "tracks" as data storage partitions. These tracks are numbered in sequence starting with 0, from the outermost rim of the disk toward the inside. The larger number of tracks on the disk surface leads to the larger storage capacity of the corresponding recording medium.

The track is then divided into "sectors", each of which is a recording unit. The sector is used as a basis for a data reading/writing operation that is generally performed to/from the disk. Although the size of the sector varies depending on the medium type, generally, the sector of the hard disk has 512 bytes. The track having the longer perimeter is provided with the larger number of sectors. This is aimed to uniformalize the recording density among the tracks to a substantial level with a consideration given to the usage efficiency of the recording media. Such a system is referred to as "Zone Bit Recording".

With such zone bit recording adopted, the recording density can be almost uniformalized among the tracks, but disadvantageously, no such uniformalization can be derived for the data transfer speed. The track locating closer to the inner radius of the disk has the lower data transfer speed.

Assuming that an HDD has such a structure that a plurality of recording media are overlaid therein on one another concentrically, it means that the tracks sharing the same number among the media are forming the cylindrical shape. This is referred to as "cylinder". The cylinder is assigned the same number as its corresponding track number, and is numbered in sequence starting with 0 from the outermost rim of the cylinder. A head is plurally inserted among the recording media, and those heads are always activated as a piece to move among the cylinders.

For addressing any target sector, a possible format is CHS, which is a format to access any desired data through specification of PBAs (Physical Block Addresses) on the disk in order of C (Cylinder), H (Head), and S (Sector).

The problem with such CHS, however, there are limitations on specifiable CHS parameters on the side of the main unit of a computer that operates as a host for the HDD. Due to such limitations, no provision can be made for hard disks increasing in capacity. This is the reason why LBA (Logical Block Address) has been adopted, with which cylinder numbers, head numbers, and sector numbers (CHS) are represented by logical consecutive numbers referred to as LBA, starting from number 0.

In a conventional HDD, for data reading/writing to/from a medium through an access made thereto, the magnetic head first scans the medium to find a track including a target sector. This is referred to as a "seek" operation of the magnetic head. Thereafter, to reach the target sector on the track, the medium rotates until the target sector comes right beneath the magnetic head. This is referred to as "rotational delay".

The larger disk capacity increases the track density, thereby narrowing the track width to a considerable extent. In view thereof, for correct data writing and reproduction, high precision is required for positioning of the magnetic head. For the purpose, the servo technology has been adopted to enable positioning of the magnetic head always in the track center. Specifically, the tracks are each written with a signal called "servo pattern" at given intervals, and those servo patterns are read by the magnetic head to check whether the magnetic head is locating at the track center. Such writing of servo patterns is done with great precision during the HDD manufacturing process. The servo regions are each written with a signal for head positioning, a cylinder number, a head number, a servo number, and the like.

Many of the conventional HDDs are provided with their own interface such as IDE or SCSI for establishing a connection with a computer. Such an interface defines a command set, which is used for disk drive control exercised by the main unit of the computer. As the basic operation for such control, specifications are made which LBA number is indicating the head sector, and how many sectors are to be accessed.

As a result of such specifications, the HDD side becomes allowed to access from the specified head sector, and during such an access procedure, a lookahead sequence can be created with a prediction what sector is to be accessed next.

Such a lookahead operation has the premise that sector allocation has been so completed with respect to a series of data that no break is observed in continuity of addresses from one sector to the next. Generally, such sectors showing no break in continuity of addresses are observed in the consecutive head numbers or track numbers.

The lookahead operation works effectively for data reading in a case where any large data is written in a row on the recording media.

Considered here is a case where a storage region is considerably fragmented, and any large data is thus broken up and the resulting small data pieces are scattered across a plurality of locations. If this is the case, the lookahead operation at the time of data reading does not work effectively as expected because it performs data designation erroneously. Such a phenomenon may be resulted from the fact that the HDD side is not grasping the file structure to be handled by the host side, e.g., main unit of a computer, asking for data reading/writing.

Considered here is also a case where the sector prediction that has been made beforehand is found wrong by a new access request coming from the host side. If this is the case, the disk drive does a seek operation with respect to the track of the sector including the data in request. Once tracking is done, the disk drive waits for the target sector to become accessible, resulting in the seek time and latency time.

Storage of the lookahead data is performed as much as the data buffer capacity allows. If the sector prediction is found wrong consecutively or intermittently, any unused old data on the data buffer is discarded in order of storage. What is more, during the lookahead operation, no seek start-up is available.

As is evident from the above, the seek time and latency time, and the ineffective lookahead operation are all blamed for the delay of seek start-up, resulting in time loss. Moreover, the ineffective lookahead operation is the reason for data loss.

For betterment, to shorten both the seek time and the latency time, the disk drive of a general type has been structured to have the higher disk rotation speed. This is because no regularity is observed for the amount and structure of data to be handled on the host side exemplified by a computer, resulting in a difficulty in achieving improvement by the access method. Increasing the rotation speed for the disk as such is, however, considered unfavorable and causes trouble in view of power consumption and storage capacity.

Moreover, many of the external storage systems such as HDDs perform error correction on a sector basis. Herein, one sector has generally 512 bytes. In this manner, any random errors to be generated in the sectors can be subjected to error correction, but no error correction is available for the random errors if those exceed an error correction range, or burst errors. With this being the case, any possible reading errors have been reduced to a certain level or lower by a retry operation or others.

Another problem here is that such a retry operation requires a re-read procedure with a wait for a full disk rotation. This causes a further delay for the data reading time.

Exemplarily in systems dealing with AV contents, the transfer speed is often required to be high for HD (High-Definition) reproduction, special reproduction, or the like, and thus even if any uncorrectable reading errors occur in the sector(s), no retry operation may be possible in terms of time. If this is the case, under the present circumstances, there is no choice but to go through the procedure with no error correction performed, consequently degrading the reproduction quality.

The above-mentioned Patent Document 2 discloses the technology using information about importance of data blocks for recording. Based on the information, any data blocks indicated as important are selectively subjected to the retry operation, but the remaining data blocks are not, for example.

The above-described Patent Document 1 discloses the technology also using information about importance of data blocks for recording. Based on the information, any data blocks indicated as important are selectively increased in their error correction capability, but the remaining data blocks are only provided with the correction capability of normal level, for example.

Such technologies serve properly to some extent especially in systems dealing with AV contents or others, but are not effective enough in terms of eliminating the need for the retry operation and correcting errors, whereby the demand therefor has been increasing.

What is more, if any disturbances such as vibrations are caused during reading of the AV contents, errors occur more than not having such disturbances. This consequently increases the amount of data that is not subjectable to error correction, thereby degrading the reproduction quality after all.

With some disturbances, errors tend to occur more often immediately after a seek operation is through. As a possible reason therefor, the disturbances may problematically lengthen the time needed to derive on-track, consequently resulting in errors.

Thus occurred errors are classified into random errors and burst errors. With no disturbance, the errors occur randomly with no exception, but with some disturbances, the randomness is increased and burst errors occur sometimes.

With this being the case, as exemplary error correction, a correction procedure may be executed to inter-sector in addition to a correction procedure applied to intra-section. In this manner, the correction procedure becomes available not only for random errors but also for burst errors. However, the problem still remains, and as the disturbance level becomes higher, the sector(s) eventually become error-uncorrectable, and the number of such sectors will show a further increase.

When the disturbance level is high, the above-mentioned time needed to derive on-track will not be uniform to a greater degree. This means positioning of the head sector for data reading becomes difficult immediately after a seek operation is through.

Another possible reason for more errors at the time of data reading is deterioration with time. Deterioration of SPM (Spindle Motor) or VCM (Voice Coil Motor) will result in the similar phenomenon as above when any earlier-written data is to be read out.

Any errors caused by this type of disturbances immediately after a seek operation is through surely adversely affect the data quality, the access time, and the transfer speed. Accordingly, there have been demands for taking measures against errors caused as such.

SUMMARY OF THE INVENTION

The present invention is proposed in consideration of the above problems, and has the following objects using data recording/reproducing system and method, a computer program, and a recording medium.

That is, the time is to be shortened to access any desired data storage location, data reproduction is to be stably performed without reducing the transfer speed, data reproduction is to be stably performed, with no retry operation and no degradation of data quality, by making random errors and burst errors error-correctable over a wider range, and by not reducing the transfer speed, and data reproduction is to be stably performed by eliminating adverse effects of errors caused by disturbances immediately after a seek operation is through, and by not reducing the transfer speed.

A data recording/reproducing system of the present invention is directed to a disk recording medium in which tracks are concentrically formed and each having a plurality of sectors, servo regions are radially oriented at predetermined positions on each of the tracks, and servo frames are formed on the tracks with the sectors placed between the servo regions. The system includes: a seek section for seeking a target track; a data access section for making accesses on the found track; and an error correction section for generating an error correction code for data error correction, and carrying out the data error correction based on the error correction code. The error correction section sets a first error correction code unit to a given amount of data, sets a second error correction code unit that is corresponding to two or more of the first error correction code units, and forms an error correction block including two or more of the first error correction code units and the second error correction code unit provided thereto, and generates the error correction block so that at least one of the sectors each provided with the second error correction code unit is located in the servo frame at a head from which the data access section first starts data reading when the seek section moves onto a specific track of the recording medium.

Moreover, the error correction section forms the error correction block in which the sector provided with the second error correction code unit is plurally placed so that two or more of the servo frames preceding or subsequent to the head servo frame on the track also include the sector provided with the second error correction code unit.

Further, the error correction section forms the error correction block in which the sector provided with the second error correction code unit is plurally placed so that all of the servo frames on the track include the sector provided with the second error correction code unit.

In these cases, the error correction section forms the error correction block so that at least the head sector in the servo frame is the sector provided with the second error correction code unit, two or more of the sectors in sequence from the head sector are the sectors each provided with the second error correction code unit, or the head sector and the tail sector in the servo frame are the sectors each provided with the second error correction code unit.

Further, the error correction section forms the error correction block so that the sector provided with the second error correction code unit is at least located at the head of the error correction block.

Still further, the error correction section forms the error correction block so that the sector provided with the second error correction code unit is plurally placed in the error correction block.

Still further, the error correction section forms the error correction block so that the error correction block is completed with one or more tracks.

Still further, the error correction section forms the error correction code with Reed-Solomon.

Still further, the error correction block to be formed by the error correction section has an interleave structure in the first or second error correction code unit.

The data access means makes an access to the whole track found by the seek section, starting a write access from the sector whichever becomes accessible first.

In such a case, at the write access, the data access section sequentially allocates a relative position address to the sectors specifically from the firstly-accessed sector on the track, and at a read access, rearranges data read from the sectors on the track in accordance with the relative position addresses so that the written data is reproduced.

Moreover, in this case, the error correction section forms the error correction block so that none of the tracks has two or more of the error correction blocks, and the error correction block is completed with one or more tracks.

A data recording/reproducing method of the present invention is directed to a disk recording medium in which tracks are concentrically formed and each having a plurality of sectors, servo regions are radially oriented at predetermined positions on each of the tracks, and servo frames are formed on each of the tracks by the sectors placed between the servo regions. The method includes: a seek step of seeking a target track; a data access step of making accesses on the found track; and an error correction step of generating an error correction code for data error correction, and carrying out the data error correction using the error correction code. In the error correction step, a first error correction code unit is set to a given amount of data, a second error correction code unit that is corresponding to two or more of the first error correction code units is set, and an error correction block including two or more of the first error correction code units and the second error correction code unit provided thereto is formed, and the error correction block is generated so that at least one of the sectors each provided with the second error correction code unit is located in the servo frame at a head from which data reading is started in the data access step when the seek step reaches a specific track of the recording medium.

Moreover, in the error correction step, formed is the error correction block in which the sector provided with the second error correction code unit is plurally placed so that two or more of the servo frames preceding or subsequent to the head servo frame on the track also include the sector provided with the second error correction code unit.

Further, in the error correction step, formed is the error correction block in which the sector provided with the second error correction code unit is plurally placed so that all of the servo frames on the track include the sector provided with the second error correction code unit.

In these cases, in the error correction step, the error correction block is formed so that at least the head sector in the servo frame is the sector provided with the second error correction code unit, two or more of the sectors in sequence from the head sector are the sectors each provided with the second error correction code unit, or the head sector and the tail sector are the sectors each provided with the second error correction code unit.

Further, in the error correction step, the error correction block is formed so that the sector provided with the second error correction code unit is at least located at the head in the error correction block.

Still further, in the error correction step, the error correction block is formed so that the sector provided with the second error correction code unit is plurally placed in the error correction block.

Still further, in the error correction step, the error correction block is formed so that the error correction block is completed with one or more tracks.

Still further, in the error correction step, formed is the error correction code with Reed-Solomon.

Still further, the error correction block to be formed in the error correction step has an interleave structure in the first or second error correction code unit.

In the data access step, an access is made to the whole track found in the seek step, starting a write access from the sector whichever becomes accessible first.

In such a case, in the data access step, at the write access, a relative position address is sequentially allocated to the sectors specifically from the firstly-accessed sector on the track, and at a read access, data read from the sectors on the track are rearranged in accordance with the relative position addresses so that the written data is reproduced.

Moreover, in this case, in the error correction step, the error correction block is formed so that none of the tracks has two or more of the error correction blocks, and the error correction block is completed with one or more tracks.

A program of the present invention is written in a computer readable format for executing on a computer system a data recording/reproducing process with respect to a disk recording medium in which tracks are concentrically formed and each having a plurality of sectors, servo regions are radially oriented at predetermined positions on each of the tracks, and servo frames are formed on the tracks with the sectors placed between the servo regions. The program also enables the above-described steps of the data recording/reproducing method.

A recording medium of the present invention is a disk recording medium in which tracks are concentrically formed and each having a plurality of sectors, servo regions are radially oriented at predetermined positions on each of the tracks, and servo frames are formed on the tracks with the sectors placed between the servo regions. The disk recording medium has such characteristics that the data having the structure of the following error correction block is recorded onto the tracks. That is, in the error correction block, a first error correction code unit is set to a given amount of data, a second error correction code unit that is corresponding to two or more of the first error correction code units is set, and two or more of the first error correction code units and the second error correction code unit provided thereto are included. Also, the error correction block is so generated that at least one of the sectors each provided with the second error correction code unit is located in the servo frame at a head from which data reading is started when the seek operation reaches a specific track of the recording medium.

With the above aspects of the present invention, the above-described objects are successfully realized.

That is, using the first error correction code (C1) unit enables correction of random errors in sectors, and using the second error correction code (C2) unit enables correction of errors beyond a error correction range or any burst errors occurring between the sectors. In more detail, with the error correction block structure of C1+C2, in the state that no retry operation is available to keep a data transfer speed at any desired level or higher, even if no error correction using the C1 is not possible, error correction using the C2 is still properly available, favorably resulting in more stable system. As such, by eliminating the need for the retry operation with error-correctable random errors and burst errors over a wider range, data reproduction can be performed stably without causing the reduction of the transfer speed.

What is more, in the error correction block structure, a sector having the second error correction code unit (C2 sector) is set to be located in the servo frame from which data reading is started when the C2 sector moves to a specific track by a seek operation. With such a setting, an access to be made immediately after the seek operation will be started from the servo frame including the C2 sector, e.g., an access is firstly made from the C2 sector. In spite of the fact that the servo frame locating at the head immediately after the seek operation often suffers access errors due to disturbances or others, including a C2 sector in the servo frame can minimize the adverse effects of the disturbances on data sectors.

Moreover, even if the ECC correction capability is not set enough and thus errors occur, errors occurring to the C2 sector can effectively reduce the data loss that will be resulted from errors. That is, even if the C2 sectors are lost due to uncorrectable errors, no data sector is lost. Thus, the data sectors can be expected to work correctly even if errors are not correctable.

Moreover, the C2 sectors may be placed not only in the servo frame locating at the head immediately after a seek operation but also in its preceding and subsequent servo frames. Such sector placement can be taken as a measure for a case with seek position displacement.

The data access section makes an access to the whole track found by the seek section, starting a write access from the sector whichever becomes accessible first. For example, the access is started from the sector of the track on which the magnetic head reaches. This favorably eliminates the rotational delay at data writing. At a read access, the access unit is a track, thereby eliminating the need for an uncertain process such as lookahead so that the timing for seek start-up can be captured without fail.

Especially in this case, at a write access, the data access section sequentially allocates a relative position address to the sectors specifically from the firstly-accessed sector on the track, and at a read access, rearranges data read from the sectors on the track in accordance with the relative position addresses so that the written data is reproduced. In this manner, basically, any sector on the track is regarded as accessible.

Thereby, data reading/writing from any arbitrary head position immediately after the seek operation minimizes the rotational delay. As a result, the seek frequency can be successfully minimized, and the access time can be favorably shortened. Also in this case, if the arbitrary head position immediately after the seek operation is in the servo frame including the C2 sector, the adverse effects to be caused by disturbances at a read access can be minimized.

Especially with such an access method, it is considered preferable if every servo frame is provided with a C2 sector.

Moreover, with such an access method, sources for write or read requests, e.g., host units such as computers connected to HDDs, have no need to worry about the sector addresses on the disk. What is better, using the relative position addresses having the shorter data size achieves effective use of the storage region.

Moreover, at a read access, the data read from the sectors on the track is rearranged exemplarily on buffer memory in accordance with the relative position addresses. In this manner, irrespective of the position of the sector from which accesses are started, the original data can be derived. If this is the case, it is considered appropriate if the error correction block is so formed that none of the tracks has two or more of the error correction blocks, and the error correction block is completed with one or more tracks.

BRIEF DESCRIPTION OF THE DRAWINGS

FIG. 4 is a diagram illustrating the servo area of a disk of the embodiment;

FIGS. 5A and 5B are both a diagram illustrating a servo frame of the embodiment;

FIG. 7 is a diagram illustrating a conversion table for an access procedure of the embodiment;

FIG. 11 is a diagram illustrating another interleave structure of the embodiment;

FIG. 15 is a diagram illustrating an exemplary ECC block structure of the embodiment;

DETAILED DESCRIPTION OF THE INVENTION

In the below, an embodiment of the present invention is described in the following order by referring to the accompanying drawings.

Figure 1:
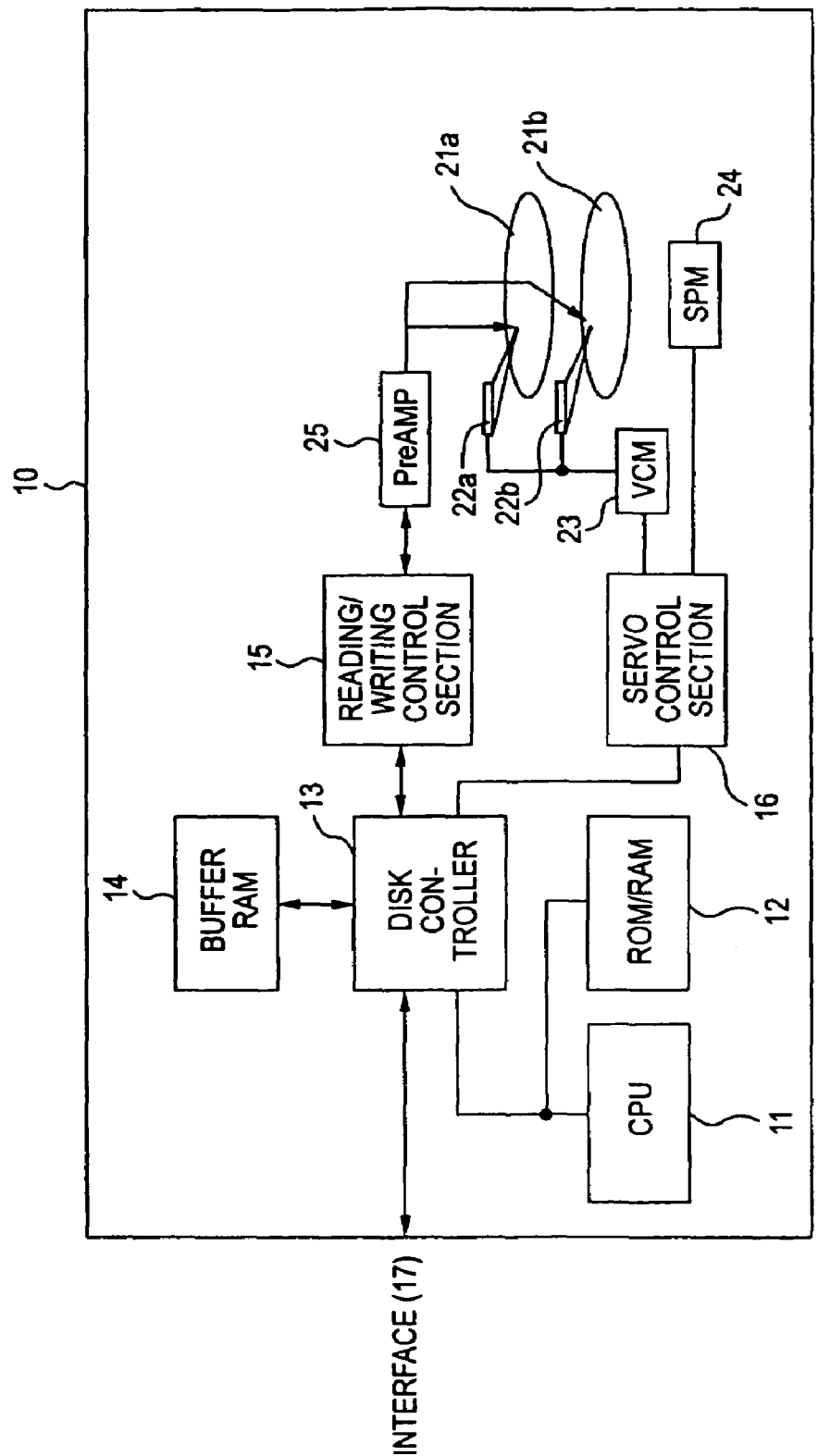
FIG. 1 is a block diagram showing the entire structure of an HDD of an embodiment of the present invention.

1. Structure of Hard Disk Drive
2. Servo Area
3. Access Operation
4. ECC Structure
5. ECC Block Setting for LBA Access
6. ECC Block Setting for Relative Address Access
7. Read Process
8. Application Example 1. Structure of Hard Disk Drive FIG. 1 schematically shows the entire structure of an HDD (Hard Disk Drive) 10 of an embodiment of the present invention.

As shown in the drawing, an HDD 10 is provide with a CPU (Central Processing Unit) 11, ROM (Read Only Memory)/RAM (Random Access Memory) 12, a disk controller 13, buffer RAM 14, a data reading/writing control section 15, a servo control section 16, and a magnetic disk 21.

The magnetic disk 21 is singly or plurally provided, and is recordable onto either or both surfaces (front and back disk sides). On the recording surface(s) of the magnetic disk 21, a head is provided. FIG. 1 shows the structure in which two magnetic disks 21a and 21b are provided, and respectively thereto, two recording/reproducing heads (magnetic heads) 22a and 22b are provided.

Such a structure allows, in a drive unit, a plurality of magnetic disks (platters) to be overlaid on one another concentrically. Specifically, the same track numbers of the magnetic disks form the cylindrical shape, and the resulting cylinder is numbered identically to the track number.

Note here that, as shown in FIG. 1, the magnetic disk 21 and the recording/reproducing head 22 has the one-to-one relationship only when the magnetic disk 21 is recordable only on its one surface.

When the front and back sides of the magnetic disk 21 are both available for recording, two of the recording/reproducing head 22 are provided thereto.

In FIG. 1, the CPU 11 executes a control code stored in the ROM/RAM 12 to exercise overall control over the operation in the HDD 10.

The disk controller 13 receives a command from a host (not shown) connected thereto through an interface 17. The CPU 11 then applies a process to the command, and the disk controller 13 uses the process result as a basis to instruct the data reading/writing control section 15 and the servo control section 16 for the hardware operation.

Any write data coming from the host through the interface 17, or data read from the magnetic disk 21 for transfer to the host is temporarily stored in the buffer RAM 14.

The data reading/writing control section 15 goes through a code modulation process so that a data pattern is created for actual recording, and then goes through data writing to the magnetic disk 21 through a preamplifier 25. The data reading/writing control section 15 also acquires the read data from the magnetic disk 21 through the preamplifier 25 for a data demodulation process.

The servo control section 16 drives, simultaneously, a voice coil motor (VCM) 23 and a spindle motor (SPM) 24 so as to control the magnetic head 22 to come within a predetermined position range on any target track on the magnetic disk 21. Here, the voice coil motor 23 is used to move an arm incorporated to the magnetic head 22, and the spindle motor 24 is provided for rotating the magnetic disk 21. The servo control section 16 also applies control to make a servo pattern on the disk to seek the head position at any predetermined position.

The magnetic disk 21 is formed with, concentrically, a plurality of tracks as data storage partitions. These tracks are numbered in sequence starting with 0, 1, 2 . . . from the outermost rim of the disk 21 toward the inside. The track is then divided into sectors, each of which is a minimum unit for the data reading/writing operation.

The data amount in a sector is 512 bytes and unchanging, for example.

The sectors in practical use for recording include, in addition to data, header information, an error correction code, or others.

With regard to how many sectors are to be provided per track, adopted is ZBR (Zone Bit Recording) with which more sectors are placed in the outer tracks having the longer perimeter than in the inner tracks. That is, the tracks of the magnetic disk 21 do not share the same number of sectors. The magnetic disk 21 is divided into a plurality of zones in the direction of the radius thereof, and the zones each have the same number of sectors.

Figure 3:
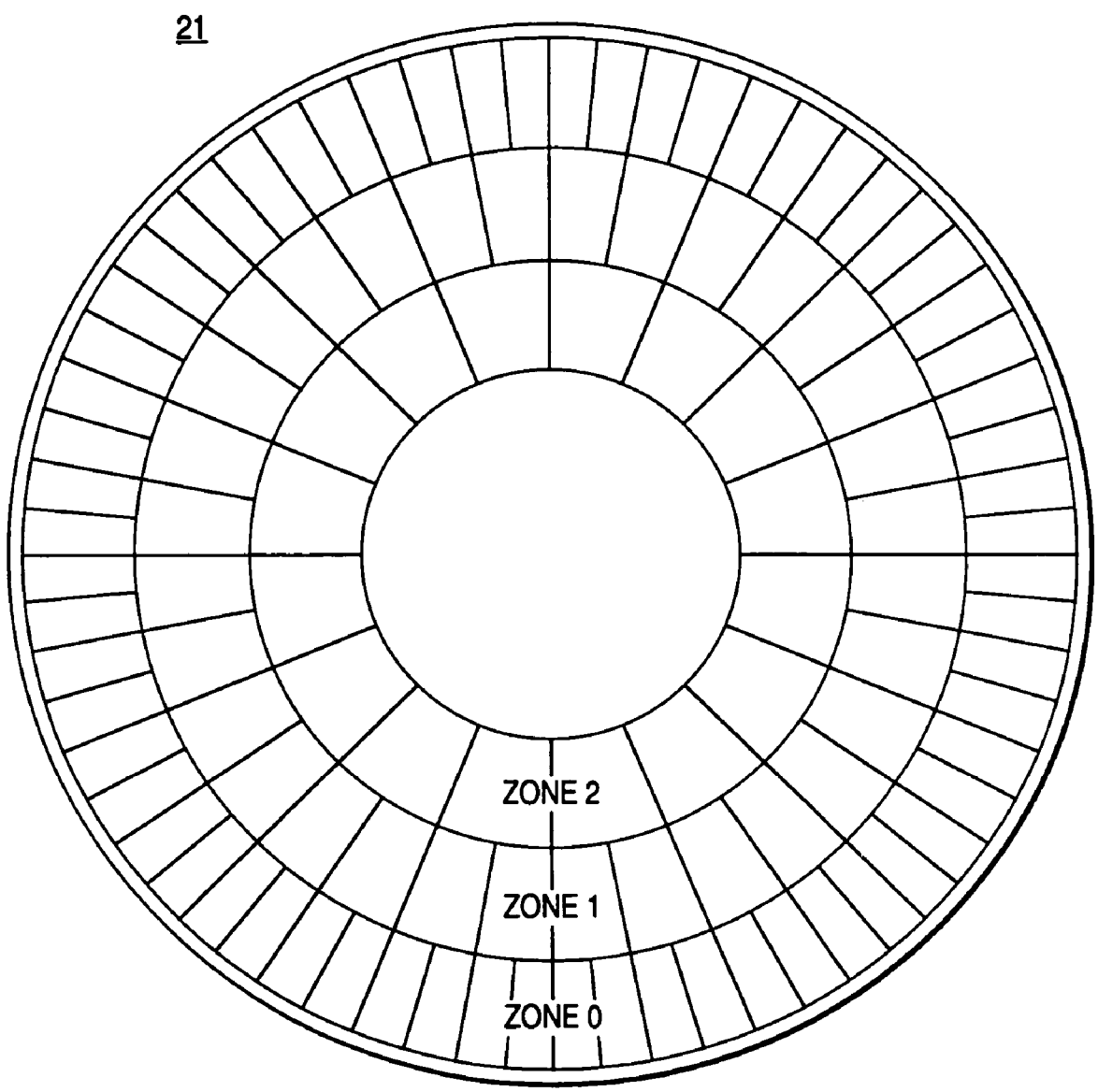
FIG. 3 is a diagram schematically illustrating the disk format structure of the embodiment.

FIG. 3 shows exemplary ZBR, in which a disk is divided into three zones. These zones are numbered in sequence starting with 0, 1, 2 from the outermost rim of the disk toward the inside. Each zone includes a plurality of tracks.

In FIG. 3, each zone is further divided into sectors. In such FIG. 3 example, by way of schematic example, the zone 0 includes 64 sectors, the zone 1 includes 32 sectors, and the zone 2 has 16 sectors. At the time of zone switching, the specific number of sectors is so determined that the track recording density falls within a predetermined range, and the storage capacity per disk is increased by keeping the rotation speed of the spindle motor 24 constant, by making a recording/reproducing clock variable, or the like.

Figure 2:
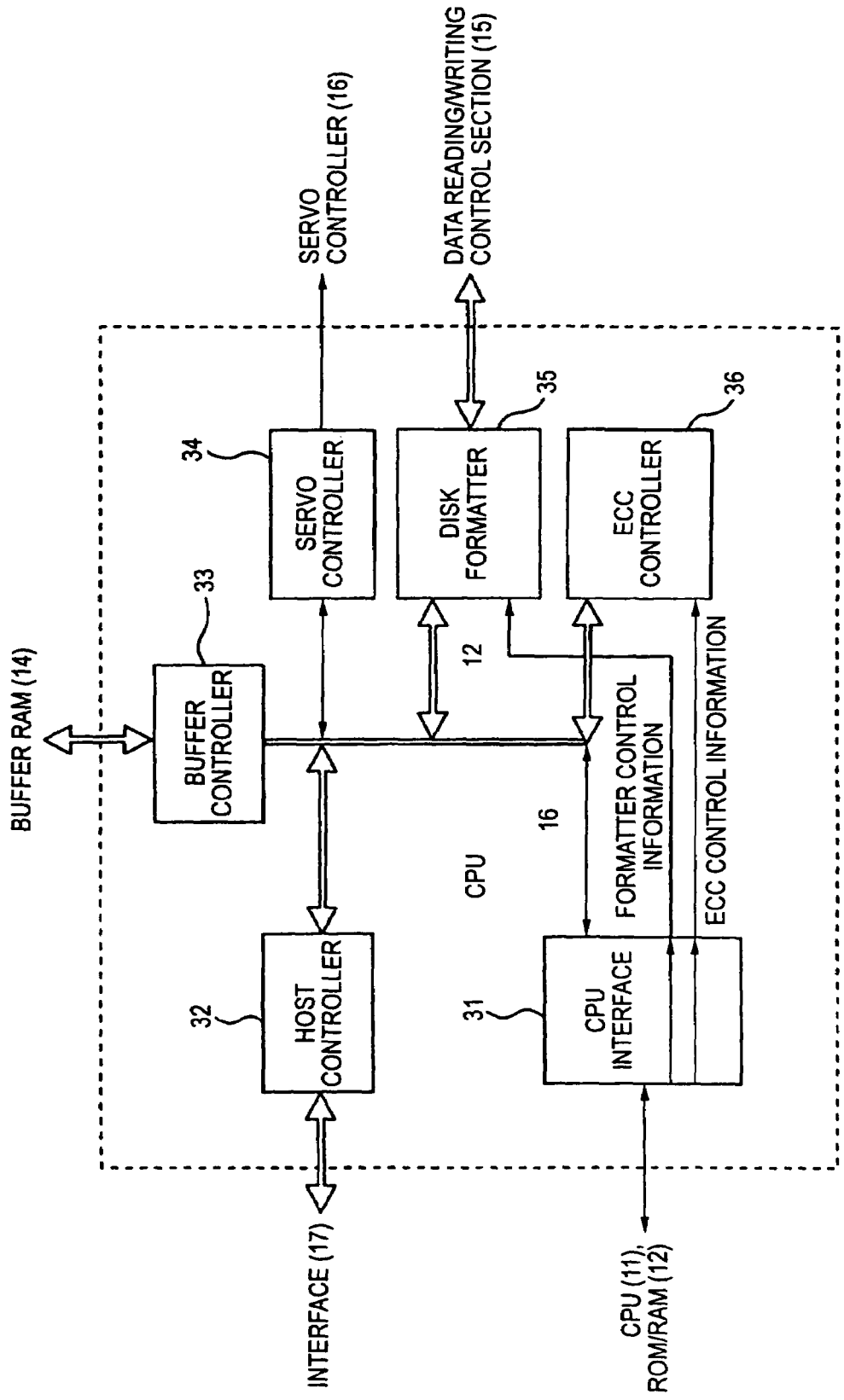
FIG. 2 is a block diagram of a disk controller provided to the HDD of the embodiment.

FIG. 2 shows in more detail the inner structure of the disk controller 13 of FIG. 1. As shown in the drawing, the disk controller 13 is provided with a CPU interface 31, a host controller 32, a buffer controller 33, a servo controller 34, a disk formatter 35, and an ECC controller 36. In FIG. 2, thick white arrows indicate flow of data.

The CPU interface 31 serves as the interface between the CPU 11 and the RAM/ROM 12, and operates to notify a command coming from the host to the CPU 11, receives the command process result from the CPU 11, or others.

The host controller 32 carries out communications with the host that is connected thereto through the interface 17.

The buffer controller 33 exercises control over data exchange among the buffer RAM 14 and the components in the disk controller 13.

Through control over the operation of the VCM (Voice Coil Motor) 23 and the SPM (Spindle Motor) 24, the servo controller 34 reads servo information from the servo pattern on the magnetic disk 21, and forwards thus read servo information to the servo control section 15.

The disk formatter 35 exercises control for writing of data on the buffer RAM 14 to the magnetic disk 21, or data reading from the magnetic disk 21.

The ECC controller 36 uses the data stored in the buffer RAM 14 to generate ECC codes for addition at data writing, or perform error correction at data reading.

Such a disk controller 13 of FIG. 2 receives, from the CPU 11, formatter control information and ECC control information.

Herein, as the access method in this example, accesses may be made based on so-called LBA (Logical Block Address), or accesses may be made by using the relative address on a track basis, which will be described later.

With a case of LBA access, the formatter control information serves as format information used for accessing the LBA-specified sector after the track found by a seek operation becomes accessible. This formatter control information is forwarded to the disk formatter 35 through the CPU interface 31 for creation of data formatter therein.

The ECC control information is used for making a structure setting of an ECC block, which includes first and second error correction codes C1 and C2. The ECC control information is used also for making a structure instruction to change the ECC block structure depending on the number of sectors for every zone, for example. The ECC control information is forwarded to the ECC controller 36 through the CPU interface 31, in which the ECC block structure is set, and the buffer RAM 14 is accessed so that a predetermined ECC process is executed.

With a case of access using the relative address on a track basis, the formatter control information serves as format information used for making accesses to a track, starting from the head sector after the track found by a seek operation becomes accessible. This formatter control information is forwarded to the disk formatter 35 through the CPU interface 31 for creation of data formatter therein.

The ECC control information is used for making a structure setting of an ECC block, which is completed with a track, or for making a structure instruction to change the ECC block structure depending on the number of sectors for every zone, for example. This ECC control information is forwarded to the ECC controller 36 through the CPU interface 31, in which the ECC block structure is set, and the buffer RAM 14 is accessed so that a predetermined ECC process is executed.

Such control information, i.e., the formatter control information and the ECC control information, is located in the ROM/RAM associating with the CPU 11 of FIG. 1. Alternatively, for example, such control information may be previously stored in the magnetic disk 21, and on start-up, read from the magnetic disk 21 for storage into the buffer RAM 14. With this being the case, the control information may be forwarded to any applicable components from the buffer RAM 14.

The HDD 10 of the present embodiment is structured as above, and with such a structure, data access control is so exercised not to cause rotational delay as will be described later. Implemented thereby is a system in which the access time is shorter, and the data transfer speed is faster. Also implemented thereby is stable data reproduction with no need for a retry operation by making random errors and burst errors error-correctable over a wider range, and by not reducing the transfer speed. Moreover, implemented thereby is less adverse effects caused by disturbances or others by arranging, in a track to be accessed, a sector of the second error correction code (C2) in a servo frame immediately after a seek operation is done.

2. Servo Area

FIG. 4 shows exemplary servo area placement in the magnetic disk 21.

In FIG. 4, solid lines in the radius direction each indicate a servo area SRV (those are not sector boundaries as those of FIG. 3).

In FIG. 4 example, the magnetic disk 21 has servo areas those are radially arranged as indicated by 32 solid lines in the radius direction. More specifically, the servo areas SVR are formed irrespective of zones 0, 1, and 2 each being a concentric circle. It means that each zone carries 32 servo areas SVR per a track. Note here that 32 servo areas SRV per track is no more than example.

In a case where a sector has 512 bytes, the size per sector (sector size) is smaller than the capacity between any two servo areas on the track. Accordingly, a plurality of sectors are placed on the track between a specific servo area and another servo area next thereto.

Such sector placement is determined mainly on a zone basis of ZBR. That is, once zone switching is performed, the number of sectors placed between such two servo areas shows a change.

At the time of zone switching, the specific number of sectors is so determined that the track recording density falls within a predetermined range, and the storage capacity per disk is increased by keeping the rotation speed of the spindle motor 24 constant, by making the recording/reproducing clock variable, or the like.

In FIG. 4 example, each track is assumed to have 32 servo areas. This is not restrictive, and even if 96 servo areas are provided, similarly, those are radially arranged with respect to the disk, and a plurality of sectors are placed between a given servo area and another servo area next thereto.

With regard to a servo band, a determination factor therefor is the number of servo areas per track, the disk rotation speed, the servo frequency, and the like, and a setting is made in accordance with system requests.

As a track part denoted by "A" in FIG. 4, FIGS. 5A and 5B each show a specific exemplary sector placed between any two servo areas.

FIG. 5A shows an example in which 8 sectors are placed between two servo areas SRV.

Note that the range sandwiched between any two servo areas SRV is referred also to as servo frame. In this sense, FIG. 5A shows an example in which 8 sectors are provided as a servo frame.

FIG. 5B shows an example in which 8.5 sectors are placed between two servo areas SRV (in a servo frame).

By referring to FIGS. 5A and 5B, the sector length is determined by the rotation speed of the spindle motor 24, the recording/reproducing clocks, or others. However, the sectors do not necessarily fit in between two servo areas SRV.

If this is the case, as FIG. 5A example, the sectors maximum in number to fit in between the servo areas are first placed, and the remaining space may be left as free space and not used for a sector. Alternatively, as FIG. 5B example, the remaining space may be used for sector placement, and if not enough for a sector, the remainder may be placed in the next servo area to derive the higher degree of efficiency.

The servo area SRV is in charge of track position control, for example. In more detail, when the magnetic head 22 moves a trace of the track closer to the servo area SRV, derived is information telling whether on-track or off-track.

Assuming here is a case where the track is out of position due to disturbances such as vibrations at data reading. When the track is out of position to a considerable extent, the servo control will be exercised all over again from the start. In other words, the data reading is interrupted, and then started from the beginning after an access is made to any target track.

3. Access Operation

As described in the foregoing, the possible access method includes LBA access and access using the relative address on a track basis. The LBA access is generally pretty popular for HDDs, and thus is not described here in detail. Described here is the address method using the relative address on a track basis.

With this access method, in the HDD (Hard Disk Drive) 10, an access is made to a track starting from a sector on which the magnetic head 22 is located. Here, the sector numbers are variable on a track, and can be provided in consideration of their relative positions.

This makes any sector on the track accessible, i.e., the need for an uncertain process such as lookahead is eliminated by regarding a track as an access unit so that the timing for seek start-up can be captured without fail. What is better, no rotational delay is caused thanks to the fact that any sector of a track is accessible. Thereby, the access time can be favorably shortened with seek frequency minimized.

For data writing onto a specific track, its sectors are each provided with a position relative to a sector that is firstly accessed.

For data reading, the firstly-accessed sector is first subjected to data reading, and based on the relative position sector number, the data is expanded on the buffer RAM 14. Thus, there is no restriction on which sector is to be read out first.

Figure 6A:
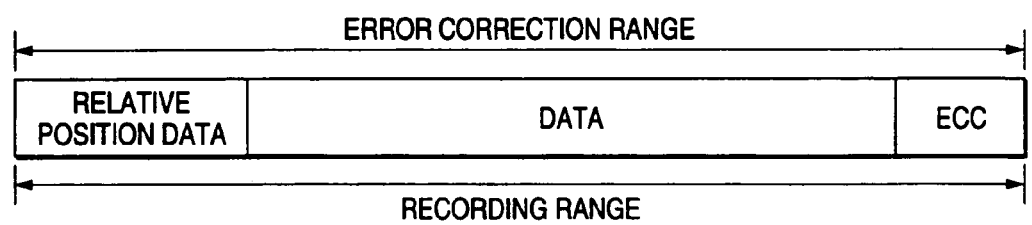
FIGS. 6A and 6B are both a diagram illustrating an error correction range of the embodiment.
Figure 6B:
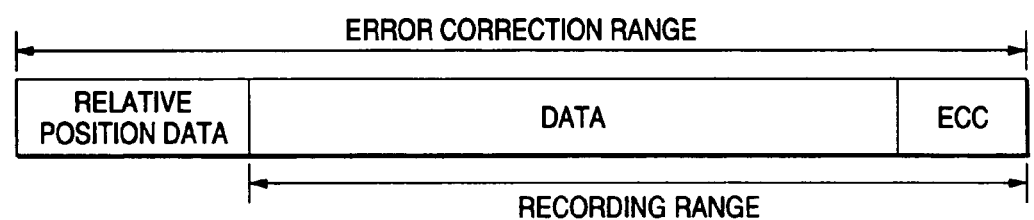

FIGS. 6A and 6B both schematically show an exemplary sector format for use by the tracks of the magnetic disk 21 to enable such an operation.

As is shown in FIG. 6A, a sector is structured by relative position data, a data body, and an ECC, all of which are regarded as an error correction range and a recording range. Specifically, the relative position data represents the relative position of the sector on the track, and the ECC is provided for applying error correction over the sector region in its entirety.

With such a structure that the relative position data is included in the error correction range as a header, even if a random error occurs in the sector, the relative position data becomes recoverable by error correction. Accordingly, implemented thereby is the smooth disk access operation.

Better still, although each sector is assigned an ID field for recording of a sector address, recorded thereinto is not an absolute position but a relative position. Thanks thereto, the ID field can be reduced in size, and such size reduction accordingly increases the field size available for the data body in the sector, thereby successfully leading to effective use of the storage region.

For data writing onto the track, the sectors are provided with their own relative position that starts from the firstly-access-started sector. Using the relative position and original storage data, ECC data is generated for storage into the corresponding sector, i.e., the relative position field, the data field, and the ECC field. Data writing is started from the firstly-accessed-sector, and thus no rotational delay will be caused.

For data reading, on the other hand, the sector firstly accessed on the track is first subjected to data reading, and based on the sector position derived by the relative position field, the storage location of the data is determined on the buffer RAM 14. In this manner, even if data reading is started from any arbitrary sector, the buffer RAM 14 uses the relative position as a basis for data rearrangement, whereby the data having been stored on the track can be reconstructed in the original order. What is better, data reading is started from the firstly-accessed-sector, and thus no rotational delay will be caused.

FIG. 6B schematically shows another exemplary sector format for use by the tracks of the magnetic disk 21 in the HDD 10 of the present embodiment.

Also in this example, similarly to the above, a sector is structured by relative position data, a data body, and an ECC, all of which are regarded as an error correction range. However, different from the FIG. 6A example, the relative position field is not a part of the recording range. Thus, by the size of the relative position field, the field size available for the data body in the sector can be larger than the above example, thereby successfully leading to more effective use of the storage region.

For data writing onto the track, the sectors are provided with their own relative position that starts from the firstly-access-started sector. Using the relative position and original storage data, ECC data is generated for storage into the corresponding sector only with the recording data and ECC data. Data writing is started from the firstly-accessed-sector, and thus no rotational delay will be caused.

For data reading, on the other hand, the sector firstly accessed on the track is first subjected to data reading, and error correction is performed using the ECC data so that the relative positions that have not been written into the sectors are generated again. Then, the resulting relative positions are used as a basis to determine the storage locations on the buffer RAM 14. In this manner, even if data reading is started from any arbitrary sector, the buffer RAM 14 is able to reconstruct the data having been stored on the track in the original order. What is better, data reading is started from the firstly-accessed-sector, and thus no rotational delay will be caused.

Described next is exemplary communications with the host at the time of data recording/reproduction according to such a sector format as above.

The HDD 10 of the present embodiment carries out communications as below, for data writing, in response to a command coming from the host that is connected thereto through the interface 17.

The host first issues a data writing command with respect to the HDD 10. In response, the HDD 10 searches for the current access sequence for the address region having the minimum seek time, and notifies the result to the host.

Upon reception of the notification from the HDD 10, the host transfers a data content of a size of the notified address region, e.g., byte count, and the number of sectors. The HDD 10 then subjects received data content to a writing operation on a track basis.

Here, as already described above, the sectors have been allocated with the relative position information with reference to the access starting position for data writing on the track. Thus, at a write request, the host side has no need to worry about information such as the cylinder number, the head number, and the sector number indicating where those are specifically written. There is no need to give specific instructions therefor, either.

Alternatively, the address region that is to be notified from the side of the HDD 10 to the host may be simply a content number for identification of contents that are requested for data writing from the host.

On the side of the HDD 10, a conversion table is provided ready for conversion between the content number and its physical storage location on the disk 21.

Due to the fact that disk access is performed on a track basis, such a conversion table may be the one as shown in FIG. 7, for example. More specifically, the table carries track numbers and head numbers each corresponding to its own applicable content number.

Note here that the conversion table includes no sector number of CHS system. This is because, with the following reasons, the conversion table has no need to give instructions which sector to first start access. That is, in the exemplary structure in which the sectors have been allocated with the relative position information with reference to the head sector from which an access is started for data writing on the track, the data can be reconstructed in the original order based on such relative position information no matter which sector is first accessed on the track.

This conversion table is written into the buffer RAM 14. Such table writing is performed by software to be executed by the disk controller 13 or the CPU 11 when the writing data is provided from the host.

The HDD 10 of the present embodiment carries out communications as below, for data reading, in response to a command coming from the host that is connected thereto through the interface 17.

The host first issues a data reading command with respect to the HDD 10. The reading command is indicating which content number is a target.

In response, based on thus indicated content number, the HDD 10 designates a target track from the conversion table of FIG. 7 to do a seek operation with respect to the magnetic head 22. Thereafter, by following the sequence of the address region that is the response result at the time of data writing, the data on the disk 21 is transferred.

Here, when such a data reading request is made, designating any wanting content number eliminates the need for the host side to worry about information such as the cylinder number, the head number, and the sector number where those are specifically written (PBA).

As described in the foregoing, in the HDD 10, an access is made to a track starting from a sector on which the magnetic head 22 is located. By regarding a track as an access unit, the need for an uncertain process such as lookahead is eliminated so that the timing for seek start-up can be captured without fail. What is better, no rotational delay is caused thanks to the fact that any sector of a track is accessible, and data reading/writing can be started from any arbitrary head position immediately after the seek operation is done. Thereby, the access time can be favorably shortened with seek frequency minimized.

Such a disk access operation is implemented in the following manner. That is, using the command process result derived by the CPU 11 as a basis, the disk controller 13 makes an instruction of hardware operation for the data reading/writing control section 15 and the servo control section 16.

4. ECC Structure

As described in the foregoing, for the HDD 10 to make accesses on a track basis, it is considered appropriate if the magnetic disk 21 is formed with ECC blocks with the basic unit of a track.

With LBA access adopted, such ECC block formation with the basic unit of a track is not necessarily required but it surely will do.

In the below, exemplified is a case of ECC block formation with the basic unit of a track.

Figure 8A:
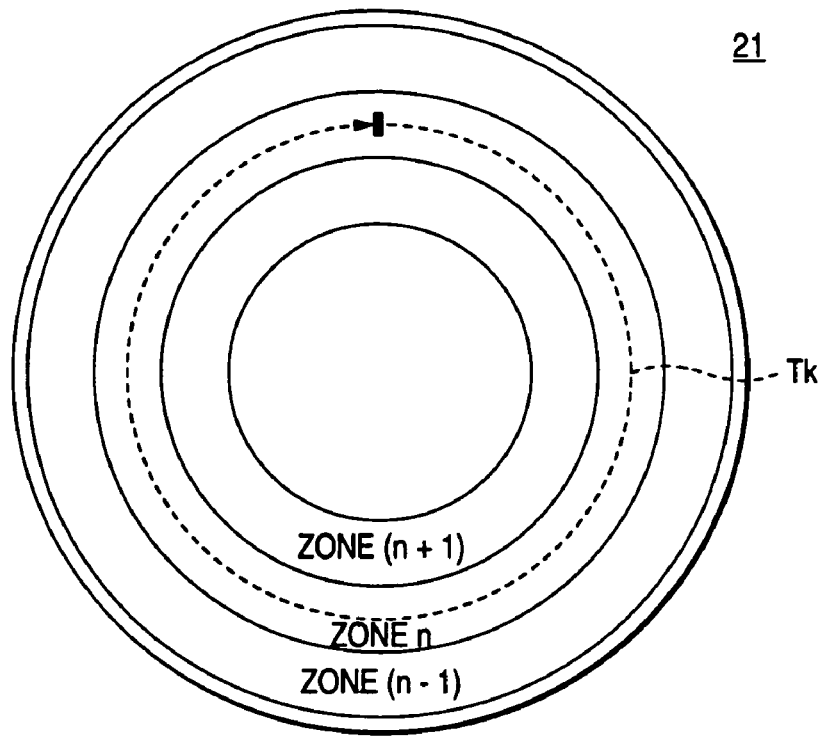
FIGS. 8A and 8B are both a diagram illustrating an ECC block serving as a track unit of the embodiment.
Figure 8B:
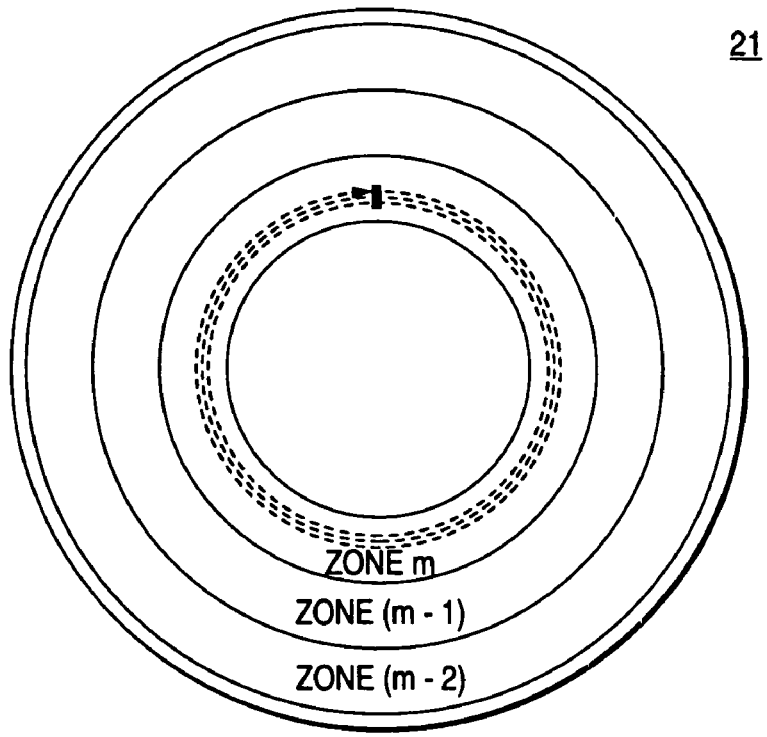

FIGS. 8A and 8B both show an exemplary ECC structure with the basic unit of a track.

In FIG. 8A example, the magnetic disk 21 is divided into zones, and a zone n is taken as an example to show the ECC block structure. That is, as the broken-lined track TK in the zone n, an ECC block includes a track as its configuration unit.

The ECC block includes a first error correction code C1 in charge of inter-sector correction, and a second error correction code C2 in charge of intra-sector correction.

The first and second error correction codes C1 and C2 form an error correction unit (ECC block structure unit) with the basic unit of a track. In each of the tracks, such an ECC block structure unit is thus never plural.

FIG. 8B shows another exemplary ECC block. Also in this example, the magnetic disk 21 is divided into zones, and a zone m is taken as an example to show the ECC block structure. In this example, an ECC block is configured by 3 tracks in the zone m. Note herein that the configuration unit is exemplified as being an integral multiple of a track, and is not surely restrictive to 3 tracks.

Also in this example, the ECC block includes a first error correction code C1 in charge of inter-sector correction, and a second error correction code C2 in charge of intra-sector correction. The first and second error correction codes C1 and C2 form an error correction unit (ECC block structure unit) with the basic unit of a track. In each of the tracks, such an ECC block structure unit is thus never plural.

Figure 9:
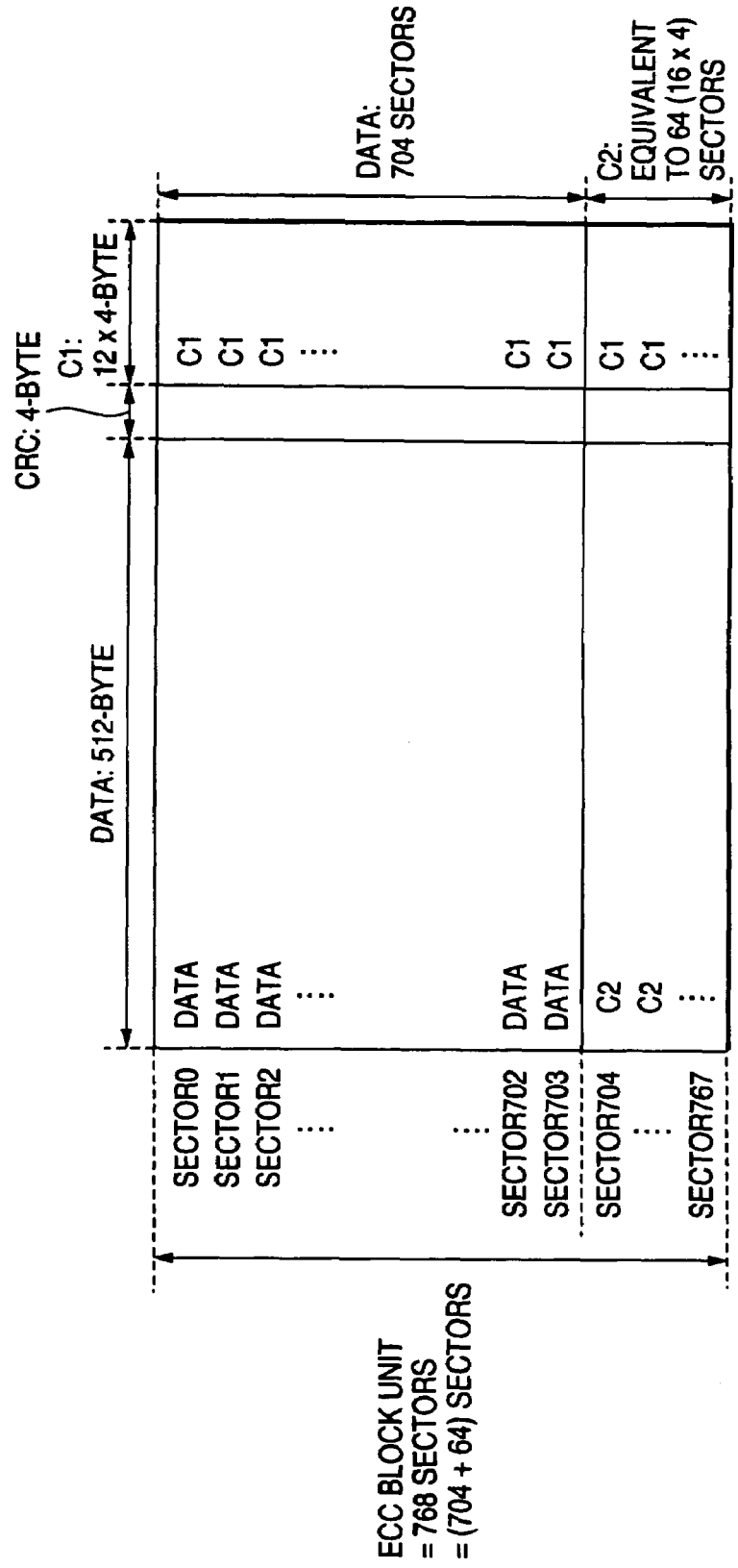
FIG. 9 is a diagram illustrating the ECC block structure of the embodiment.

FIG. 9 shows an exemplary ECC block structure of the magnetic disk 21 with the ECC block structure of FIGS. 8A and 8B adopted.

Herein, as an ECC correction code, exemplarily used is a Reed-Solomon code having the symbol length of 8.

Assuming here is that a specific zone of a specific magnetic disk has 768 effective sectors per track. A sector is structured by 4 interleaves with 512-byte data, a 4-byte CRC (Cross Check Code), and a C1 having 48-byte in total.

With the exemplary ECC block structure of FIG. 9, 704 sectors from sectors 0 to 703 serve as a data region, and 64 sectors from sectors 704 to 767 serve as a C2 region. The C2 region is structured by 4 interleaves, each of which has 16 sectors, for example.

With such a structure being the case, an ECC block has 768 sectors in total, serving as a track in the corresponding zone. As such, the unit of a track can be implemented.

Considered now is the error correction capability in the above example.

With regard to a random error, using a C1 enables error correction up to 24 bytes per sector (up to 48 bytes in length if byte disappearance information is available).

With regard to a burst error, using a C2 enables error correction up to 32 sectors in length per track (up to 64 sectors if CRC result is used).

Here, the maximum number for error correction is actually set in consideration of possible wrong correction, or others. For example, instead of 32 sectors maximum, 24 sectors may be set correctable, and such a setting may be made to achieve the possibility of wrong correction closer to 0 as close as possible.

Alternatively, the same is applicable in a case where the ECC block is the given number of sectors instead of the unit of a track.

If this is the case, the ECC block unit may be reduced in size, e.g., an ECC block has 192 (=data of 176 sectors+C2 of 16 sectors) sectors.

Described now is the reason why such error correction blocks are used.

Many of conventional HDD systems, error correction is only available on the basis of a sector, which includes 512-byte data and information bits.

Therefore, although any random errors occurring in the sectors are subjectable to error correction, any random errors beyond an error correction range or any burst errors, i.e., continuous errors over a sector, are not.

In such cases, any possible reading errors can be reduced to a certain level or lower by a retry operation or others. The problem here is that, however, executing such a retry operation once basically means the longer access by a track.

In spite of the above achievement of shorter access time derived by the track-basis access, a retry operation resultantly increases the access time after all, causing a further delay for the data reading time.

Exemplarily in systems dealing with AV contents, the transfer speed is often required to be high for HD (High-Definition) reproduction, special reproduction, or the like, and thus even if any uncorrectable reading errors occur in the sector(s), no retry operation may be allowed in terms of time. If this is the case, under the present circumstances, there is no choice but to go through the procedure with no error correction performed, consequently degrading the reproduction quality.

For betterment, while implementing stable data reproduction with the above ECC structure, an attempt is made to eliminate as much as possible such a situation as requiring a retry operation due to no-available error correction.

To be more specific, in addition to C1 correction that is conventional sector-basis error correction, C2 correction capable of intra-sector correction is additionally performed.

The error correction unit (ECC block) including both C1 and C2 may be so structured as to be completed with a track, for example.

If the ECC block unit including both C1 and C2 is completed with a track, a track can be regarded as an access unit, thereby leading to data access control with no possible rotational delay. That is, the time taken to access any desired data storage location can be shortened. What is better, with a setting that a track is not allowed to carry two or more ECC blocks, data access control with no possible rotational delay can be similarly implemented even if the ECC structure is of the unit of a plurality of tracks.

In FIG. 9, with the Reed-Solomon code having the symbol length of 8, 512-byte data is applicable with interleave.

Figure 10:
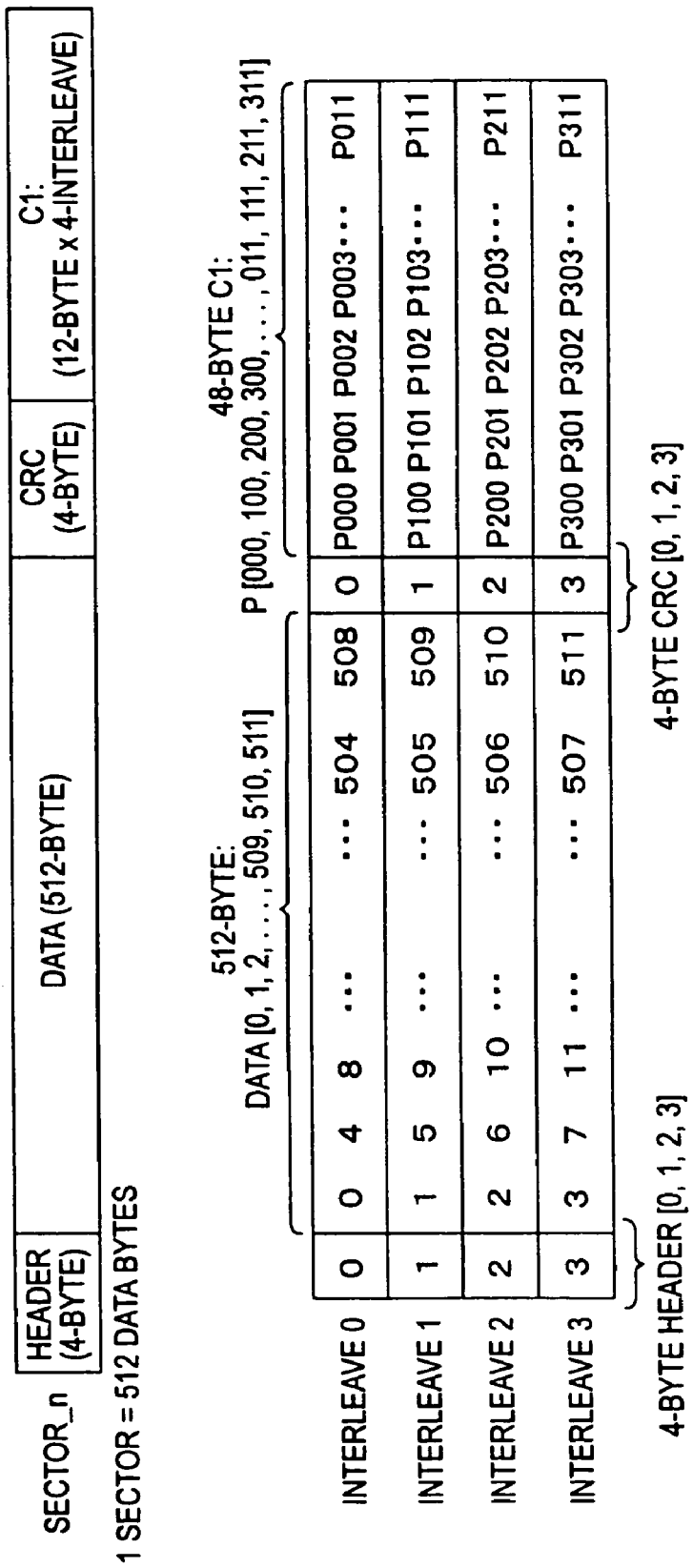
FIG. 10 is a diagram illustrating the interleave structure of the embodiment.

FIGS. 10 and 11 both show an exemplary case where interleave is applied in the ECC block structure of the present embodiment.

In FIGS. 10 and 11, interleave is applied to a sector n, and a sector is structured by a 4-byte header, 512-byte data, and a 4-byte CRC. Such a sector is divided into four, and to each of the division results, a 12-byte ECC code C1 is added.

As an example, an interleave 0 includes a 1-byte header, 128-byte data, and a 1-byte CRC together with a 12-byte parity added. This is similarly applicable to interleaves 1, 2, and 3.

The interleave placement is made as follows in the sector, i.e., the interleave 0 is placed at zero-th, the interleave 1 at first, the interleave 2 at second, the interleave 3 at third, and at fourth, the interleave 0 is placed again.

In each interleave, a 4-byte header comes first, 512-byte data comes second, and a 4-byte CRC comes third. Subsequent to the CRC, a C1 code follows.

FIG. 10 example shows the placement as a result of division by interleave, and FIG. 11 shows the example in which addresses 0 to 567 are allocated on memory.

FIGS. 10 and 11 examples are both of sector-basis likewise in FIG. 9, i.e., a sector includes a 4-byte header, 512-byte data, and a 4-byte CRC with an ECC code C1 having 48 bytes in total, and the sector mainly serves as a recording sector onto the magnetic disk 21.

Note here that the actual recording data is additionally provided with preamble, synchronous signal, postamble, or others. As alternative sector-basis structures, a format with no header file or a format with no CRC is a possibility.

For such a interleave structure, a determination factor may be mainly the hardware structure. With the Reed-Solomon code having the symbol length of 8, the interleave structure may be applied as shown in FIG. 10 in the C1 direction, i.e., sector direction.

Here, the above-described interleave may be applied to C2 in charge of intra-sector ECC. With this being the case, in FIG. 10, the similar structure and effects can be achieved by replacing Byte in Data section with a sector for expansion in the C2 direction, i.e., direction orthogonal to the sectors.

In the above example, a sector is assumed as 512-byte data. This is not the only option for the sector size, and for example, a sector may be 1024-byte or 2048-byte data to implement the ECC block structured for every sector or between sectors similarly to the above.

In a case where an ECC block is completed with a track, once zone switching is performed with respect to the magnetic disk 21, the number of sectors per track varies. Thus, with the structure in which the number of ECC parities are the same, the error correction capabilities will considerably vary among zones.

As a measure taken therefor, the ECC block structure may be changed on a zone basis so that the redundancy of the error correction code falls in a given range. In this manner, the error correction capability can be in the same level over the tracks of the disk.

In FIG. 3 example, per track, the zone 0 has 64 sectors, the zone 1 has 32 sectors, and the zone 2 has 16 sectors. These zones share the same rotation speed, but have each different operation clock so that the track recording density in each zone falls within a given range.

In this case, the ECC is added with a C1 for every sector. The C1 structure is unchangeable and remains the same, specifically, as the structure of FIG. 9, for example.

As to the C2 structure, the zone 0 has 64 sectors, 8 sectors of which are C2 parities. Similarly, the zone 1 has 32 sectors, 4 sectors of which are C2 parities, and the zone 2 has 16 sectors, 2 sectors of which are C2 parities.

Such a structure keeps constant the ratio of the data sectors per track to the C2 parity sectors in the respective zones, and make uniform the C2 correction capability among the zones.

Note here that with the actual format, the redundancy of the ECC part may be so set as to fall within a given range. This is because there are few divisible numbers such as the relation between zone and the number of sectors.

As such, in addition to have C1+C2 structure with an ECC block completed with a track, and have the interleave structure, the redundancy of the ECC part is controlled to fall within a given range with changeable ECC structure on a zone basis, stable data reproduction is achieved with which error correction is available for random errors and burst errors over a wider range, i.e., tracks of a disk.

In this example, the C1 part of the ECC structure is unchangeable but the C2 part thereof is changeable. Thereby, the redundancy of the ECC part, i.e., error correction capability, is controlled to be within a given range. Alternatively, the error correction capability may be controlled to fall within a give range with the C1 part made changeable on a zone basis but the C2 part unchangeable, or C1 and C2 may be comprehensively controlled to control the error correction capability to fall within a given range.

5. ECC Block Setting for LBA Access

Although the ECC block structure is basically the same as above, embodied herein is the ECC block structure in which, as on-track sector placement, a C2 sector is placed in a servo frame locating at the head from which access is started immediately after a seek operation is done to the track.

About such an ECC block structure, described are a case with LBA access, and a case with an access method using the above-described track-basis relative addresses.

Figure 12:
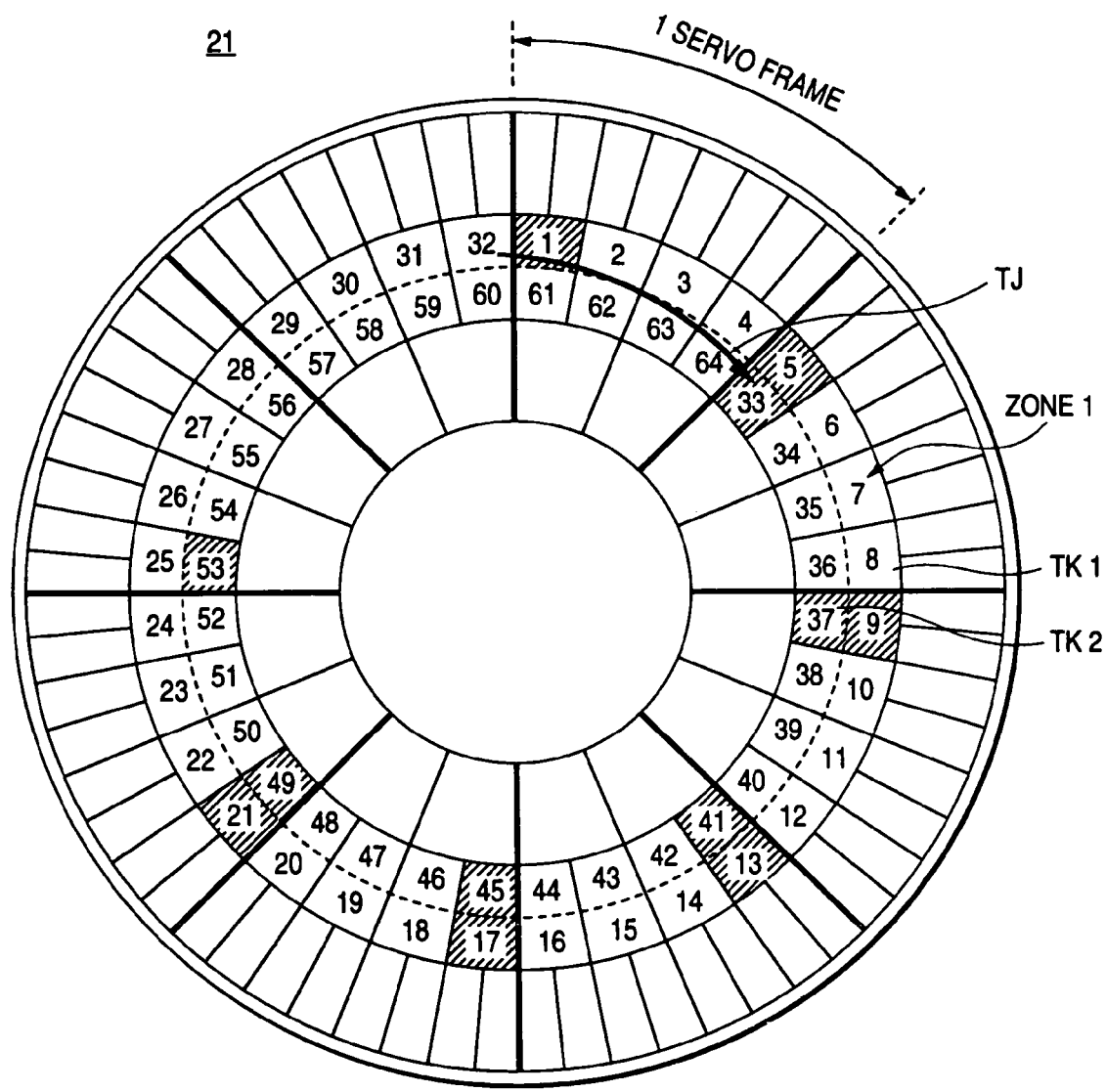
FIG. 12 is a diagram illustrating exemplary C2 sector placement under LBA access of the embodiment.
Figure 13:
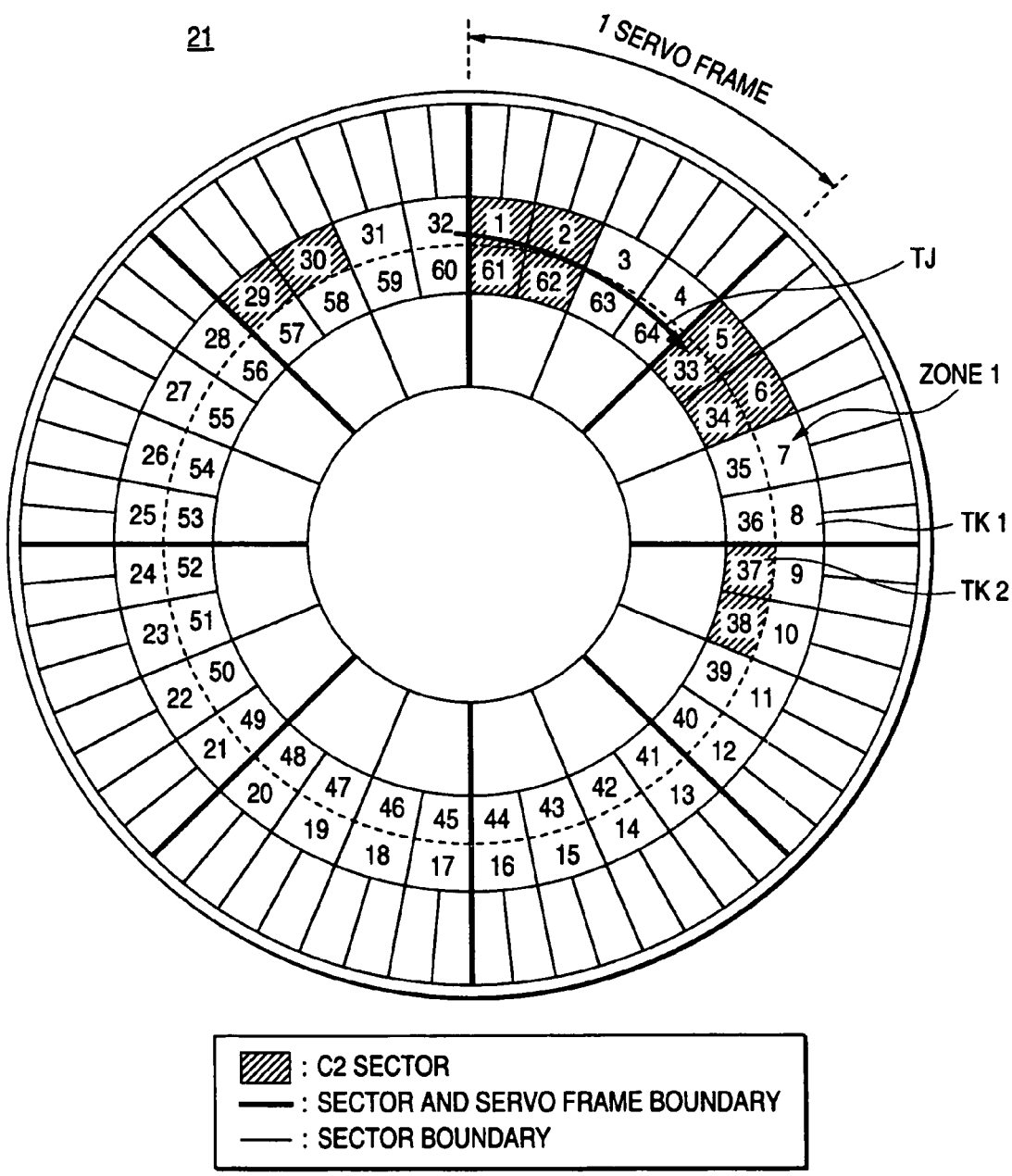
FIG. 13 is a diagram illustrating another exemplary C2 sector placement under the LBA access of the embodiment.
Figure 14:
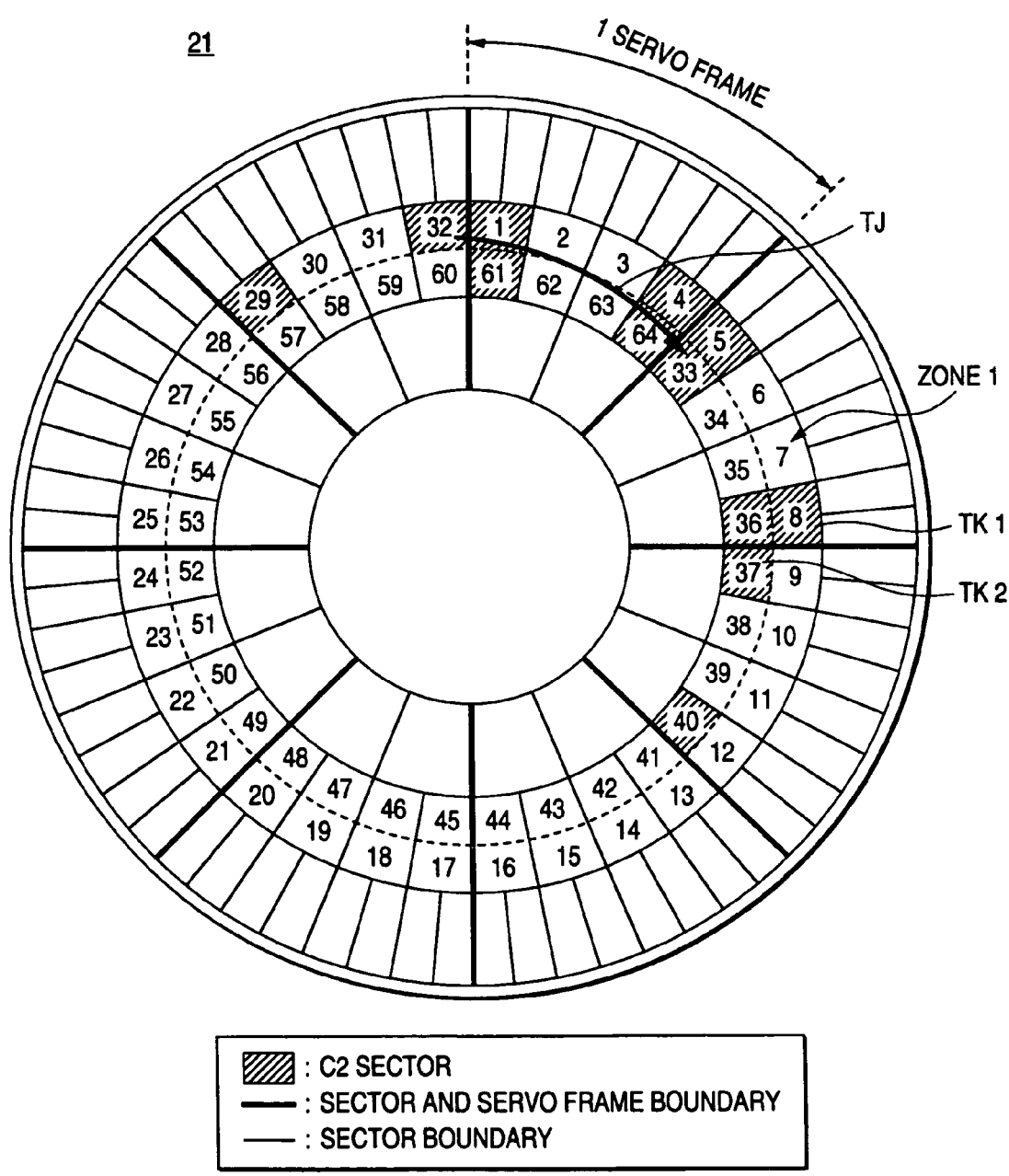
FIG. 14 is a diagram illustrating still another exemplary C2 sector placement under the LBA access of the embodiment.

By referring to FIGS. 12 to 14, described first is the case with LBA access.

FIG. 12 shows in detail the sector placement of the above example. In this case, the access unit is not restricted to a track, and each sector is assigned an LBA.

FIG. 12 schematically shows the sector placement in two tracks in the zone one 1 locating at the middle part of the disk 21 having the zones 0, 1, and 2 as shown in FIG. 3. Exemplified here is a case that the tracks in the zone 1 each have 32 sectors similarly to the above.

The drawing shows two types of radial lines, i.e., thick and thin solid lines. The thin lines each indicate the sector boundary, and the thick lines each indicate both the servo frame boundary and sector boundary. For example, in each of the tracks, the thick line means a servo area SRV (refer to FIG. 5) is formed there, and an area between the thick lines is a servo frame.

In FIG. 12 example, in the zones 0, 1, and 2, the tracks are all each divided into 8 servo frames. Due to the fact that a track has 32 sectors in the zone 1, a servo frame therein has 4 sectors.

As shown in the drawing, any specific 2 tracks (TK1 and TK2) in the zone 1 are sequentially assigned LBA numbers from "1" to "64", for example. Here, these "1" to "64" are illustrative numbers, and actually serve as LBA numbers, which are assigned in sequence to all of the tracks from the outermost track rim of the disk toward the inside.

In the track TK1 in the zone 1, the sectors are assigned LBA numbers of "1" to "32", and in the next track TK2, the sectors are assigned LBA numbers of "33" to "64". In this case, the head sector "1" in the track TK1 and the head sector "33" in the track TK2 are both off the track by a track skew, which is defined by information about the rotation speed, servo area, or others.

The track skew is of the unit of a servo frame including a plurality of radially-provided servo areas on the disk.

That is, as a seek operation to be done from a certain track to the next track, the head sector is so set as to be displaced in consideration of a track skew by a servo frame due to the disk rotation and the time taken for track jump as indicated by an arrow TJ.

The sectors "1" to "32" in the track TK1 are first accessed, and then the sectors in the track TK2 are accessed. At this time, because the head sector is displaced by a track skew, accesses are to be made from the sector "33" with the shorter wait time after the seek operation is through.

LBA access at data reading starts from LBA "1" to "32" in the track TK1 of FIG. 12, and then LBA "33" to "64" after the track TK2 is through with a seek operation.

In this example, the track has the ECC block structure, and out of the 32 sectors in the zone 1, 26 sectors are data sectors, and 6 sectors are C2 sectors.

By referring to FIG. 12, the track TK1 has the C2 sectors of LBA "1", "5", "9", "13", "17", and "21", and in the next track TK2, the C2 sectors are LBA "33", "37", "41", "45", "49", and "53".

It means that the head sector (LBA "1" in the track TK1, or LBA "33" in the track TK2) in the head servo frame after the seek operation is at least included, and also in the subsequent 5 servo frames, their head sectors each have a C2 sector.

FIG. 13 shows another exemplary structure.

Similarly to FIG. 12 example, LBA access at data reading starts from LBA "1" to "32" in the track TK1, and then LBA "33" to "64" after the track TK2 is through with a seek operation. In this example, the track similarly has the ECC block structure, and out of the 32 sectors in the zone 1, 26 sectors are data sectors, and 6 sectors are C2 sectors.

In FIG. 13 example, the track TK1 has the C2 sectors of LBA "1", "2", "5", "6", "29", and "30", and in the next track TK2, the C2 sectors are LBA "33", "34", "37", "38", "61", and "62".

It means that the head sector (LBA "1" in the track TK1, or LBA "33" in the track TK2) in the head servo frame after the seek operation is at least included, and also in its preceding and subsequent servo frames, their head sectors each have a C2 sector. In each of the servo frames, the head sector and the subsequent sector are also made C2 sectors.

FIG. 14 shows still another exemplary structure.

Similarly to FIG. 12 example, LBA access at data reading starts from LBA "1" to "32" in the track TK1, and then LBA "33" to "64" after the track TK2 is through with a seek operation. In this example, the track similarly has the ECC block structure of a track, and out of the 32 sectors in the zone 1, 26 sectors are data sectors, and 6 sectors are C2 sectors.

In this FIG. 14 example, the track TK1 has the C2 sectors of LBA "1", "4", "5", "8", "29", and "32", and in the next track TK2, the C2 sectors are LBA "33", "36", "37", "40", "61", and "64".

It means that the head sector (LBA "1" in the track TK1, or LBA "33" in the track TK2) in the head servo frame after the seek operation is at least included, and also in its preceding and subsequent servo frames, their head sectors each have a C2 sector. In these servo frames, their tail sectors are also the C2 sectors.

Figure 15:
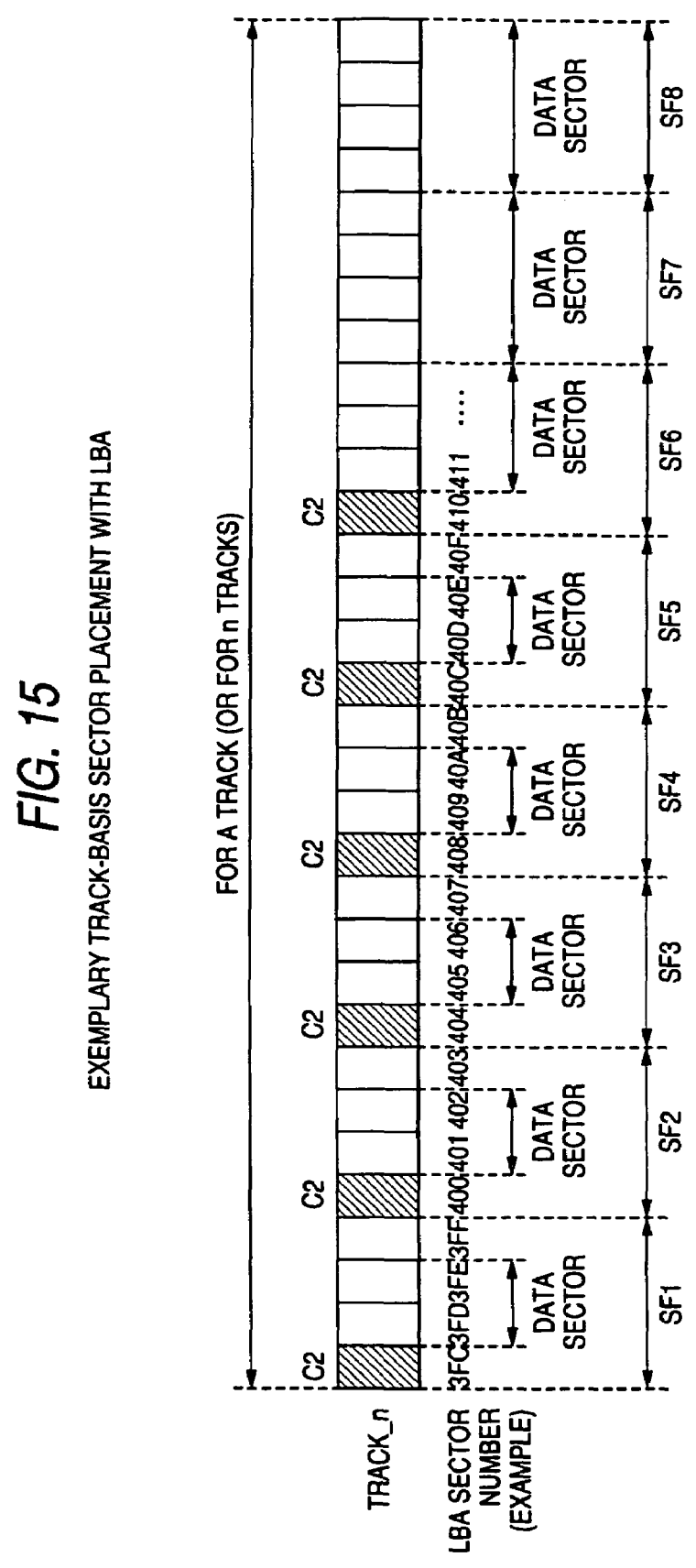
Figure 16:
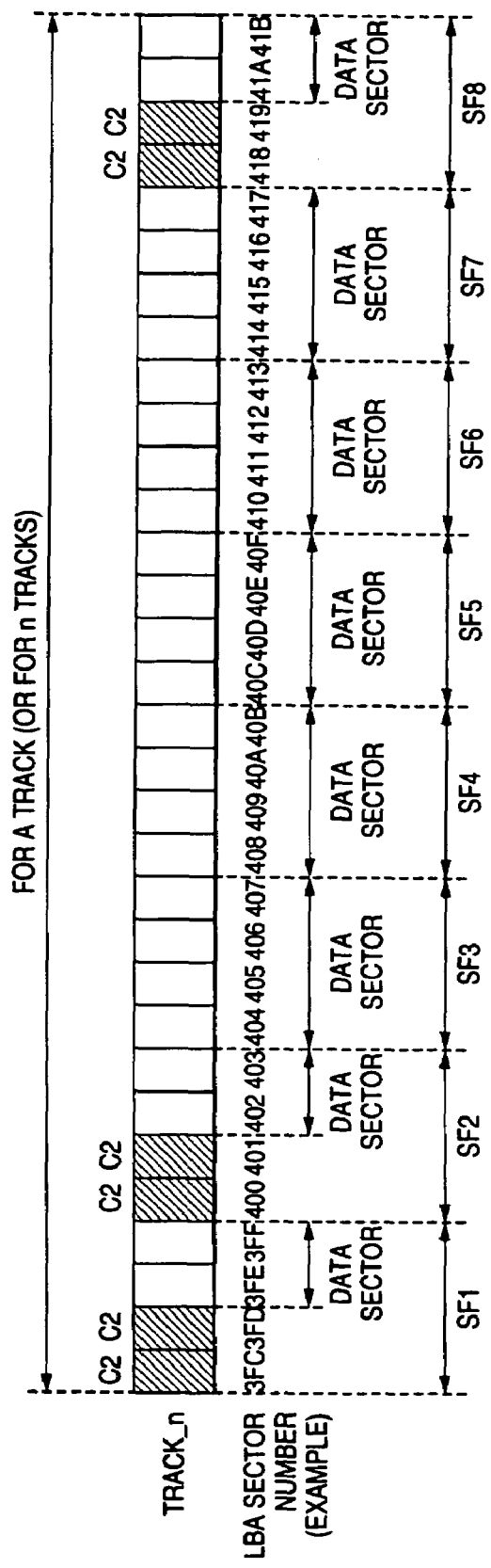
FIG. 16 is a diagram illustrating another exemplary ECC block structure of the embodiment.
Figure 17:
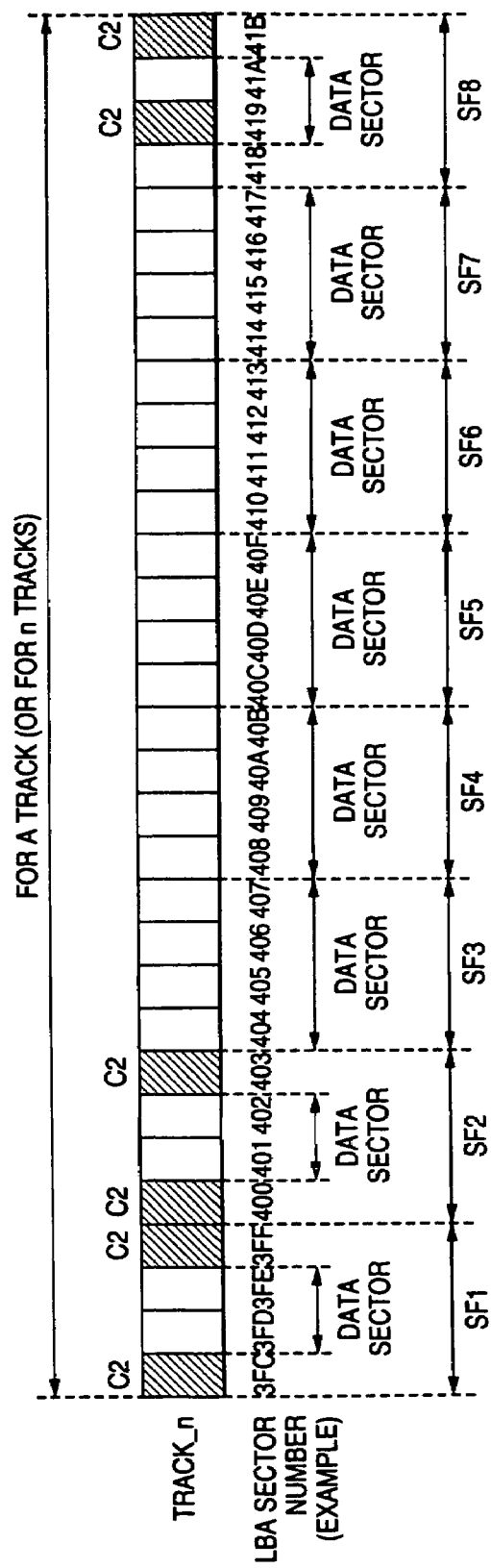
FIG. 17 is a diagram illustrating still another exemplary ECC block structure of the embodiment.

Such 3 placement examples are all equivalent to recording/reproduction in the ECC block structure of FIG. 9 example, in which the C2 sector is plurally provided in the ECC block at their predetermined positions. FIGS. 15 to 17 examples all show such a state.

FIGS. 15 to 17 examples have a correspondence, respectively, with the track in zone 1 of FIGS. 12 to 14 examples, and for example, show the sectors structuring the ECC block for a track. Therein, a track includes 8 servo frames SF1 to SF8.

In those examples, the LBA number starts from "3FC" from the head sector.

FIG. 15 shows the sector placement in a case with FIG. 12 example, i.e., the head sector is a C2 sector in the given servo frames (SF1 to SF6) including the head servo frame. In this case, the C2 sectors are sectors "3FC", "400", "404", "408", "40C", and "410".

As FIG. 15 example, as a result of ECC block formation including the C2 sectors as such, and data writing into a specific track, the head of the given number of servo frames including the head servo frame will be the C2 sector as shown in FIG. 12.

Assuming here that the LBA "1" in the track TK1 of FIG. 12 is actually "3FC", formed is the ECC block including the C2 sector as FIG. 15. And if data writing is made to the track TK1, the C2 sectors will be "1", "5", "9", "13", "17", and "21" as shown in FIG. 12.

Also in the next track TK2, formed is the ECC block with the C2 sectors formed as shown in FIG. 15, and data writing thereto makes the sectors "33", "37", "41", "45", "49", "53", and "33" the C2 sectors.

That is, by writing the ECC-block-set data in accordance with LBA, at data reading, the head sector of the head servo frame from which data reading is started immediately after on-track can be provided with the C2 sector of the ECC block.

FIG. 16 shows the sector placement in a case with FIG. 13 example, and in the head servo frame and its preceding and subsequent servo frames (SF1, SF2, and SF8), their two head sectors from the head are all a C2 sector. In this case, the sectors "3FC", "3FD", "400", "401", "418", and "419" are all a C2 sector.

As such FIG. 16 example, as a result of ECC block formation including the C2 sectors, and data writing into a specific track in accordance with LBA, the head servo frame and two sectors from the head of its preceding and subsequent servo frames will be all a C2 sector as shown in FIG. 13.

FIG. 17 shows the sector placement in a case with FIG. 14 example, and in the head servo frame and its preceding and subsequent servo frames (SF1, SF2, and SF8), their head sectors and tail sectors are all a C2 sector. In this case, the sectors "3FC", "3FF", "400", "403", "418", and "41B" are all a C2 sector.

As such FIG. 17 example, as a result of ECC block formation including the C2 sectors, and data writing into a specific track in accordance with LBA, the head servo frame, and head and tail sectors of its preceding and subsequent servo frames will all have a C2 sector as shown in FIG. 14.

Figure 18:
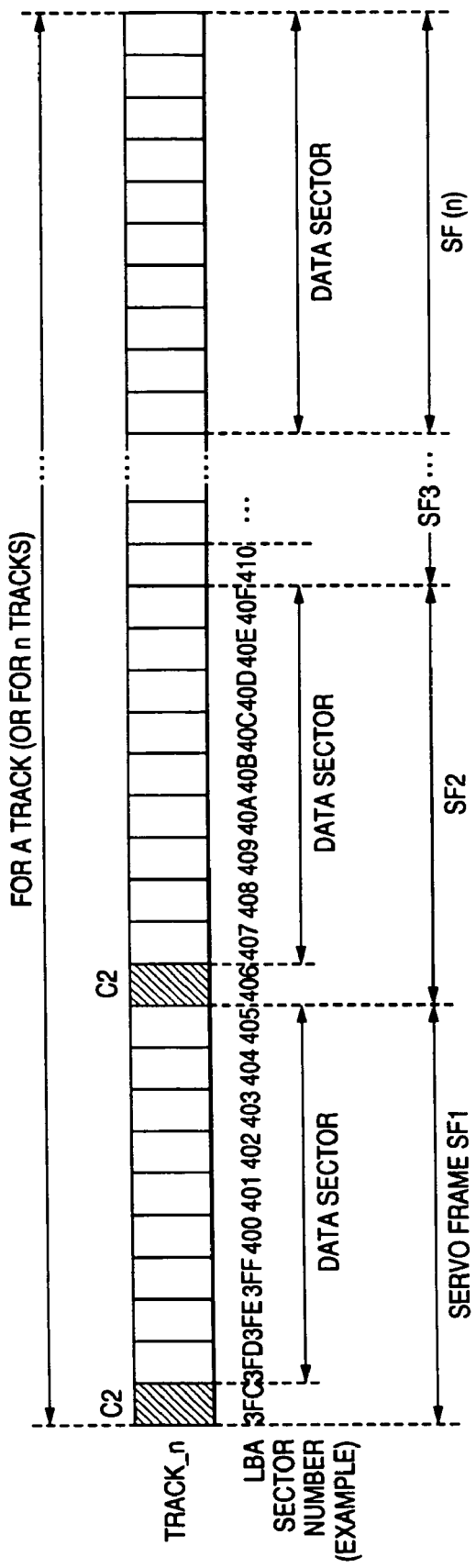
FIG. 18 is a diagram illustrating still another exemplary ECC block structure of the embodiment.

The above three placements are described by way of example, in which a track has 32 sectors including 6 sectors being the C2 sectors, and a servo frame includes 4 sectors. FIG. 18 shows more general exemplary sector placement in which the C2 sector is plurally placed at their predetermined positions in the ECC block.

FIG. 18 shows the sectors structuring the ECC blocks by a track or n tracks as an example in which the LBA number starts from 3FC.

Assuming that 10 sectors can be accommodated in a servo frame, a C2 sector accompanies 9 sectors all serving as a data sector as FIG. 18. That is, as FIG. 12 (FIG. 15) example, the head sectors of the predetermined number of servo frames including the head servo frame SF1 are all a C2 sector.

The reasons for such C2 sector placement as above examples are as below.

When data reading is carried out successively at high speed with a seek operation required, to keep a given transfer speed, there may be cases where read errors are difficult to be recovered by a retry operation even if those occur. What is worse, read errors will occur more frequently if any disturbances such as vibrations are caused, and often occur in the vicinity of the area at which data reading is started immediately after a seek operation and on-track. A possible reason therefor is that the track positioning is not done with enough stability, for example.

Considered here is a case where data reading immediately after a seek operation is very unstable, or a case where more sector errors occur than expected due to many errors as a result of data reading made immediately after a seek operation under any disturbed state, and exceeds the C2 correction capability set for the ECC block.

When no error correction is available, the read data is output as it is with no error correction process or others. The sector area where many errors are observed is in the vicinity of the area at which data reading is just started.

Under such circumstances, as in the present embodiment, by placing a C2 sector being a redundant sector in the vicinity of the area at which data reading is just started, i.e., in the head servo frame, data loss due to errors can be reduced even if those errors are uncorrectable.

As an example, an error correction block is generated for data writing in such a manner that, after a seek operation reaches a specific track, the head sector of a servo frame in charge of the first track reading is a C2 sector. Thereby, at a read access, the sector immediately after reading is started can be a C2 sector being a redundant part.

To be more specific, by forming an error correction block at least including a C2 sector at the head thereof, a read access is started from the C2 sector immediately after on-track.

In this case, assuming that errors are occurring due to disturbances or others, the erroneous sectors are to be many observed in the part of the C2 sector.

This thus enables data output imposing less effects on any erroneous sectors that have been output without recovery. This is because such erroneous sectors are often occurring in the redundant sectors. Accordingly, implemented thereby is more stable data reproduction.

As is understood from the above, it is considered most effective if the head sector of the servo frame SF1 from which data reading is started is a C2 sector as above.

Herein, allocating one or more sectors including the head sector immediately subsequent to the servo frame to any given C2 sector(s) is surely left to the discretion of systems.

For example, when the disturbances such as vibrations are high in level, the seek time is required longer for any expected given skew. Thus, the position from which data reading is started immediately after on-track may be displaced to a considerable extent. If a consideration is given to such a seek time difference resulted from disturbances, as the above examples, it is considered preferable if the C2 sector is placed in the servo frames except for the one at the head, e.g., the given number of servo frames subsequent to the servo frame at the head, or servo frames before and after the head servo frame.

Moreover, if a consideration is given to the fact that disorder immediately after a seek operation under the disturbed state continues for awhile, as FIG. 13 example, it is considered effective if the predetermined number of sectors subsequent to the head sector in the servo frame are all replaced with C2 sectors.

Further, if a consideration is given to the fact that errors often occur in the sector at the tail in the servo frame, it is considered effective if the head and tail sectors are replaced with a C2 sector in the servo frame.

In FIGS. 12 to 14, exemplified is a case where the ECC block structure is of a track basis, but this is surely not restrictive. That is, even when the ECC block structure is not of a track basis but the number of sectors, similarly, data reproduction is implemented in more stable manner by having such a structure that the first reading sector in the track after a target moves to a certain track by a seek operation is the C2 sector.

In the above examples, the number of C2 sectors in the ECC block is so set as to derive any given redundancy in accordance with the number of sectors in the ECC block, and in FIGS. 12 to 14 examples, 6 sectors are C2 sectors out of 32 sectors. This is surely no more than an example, and the number of servo areas is also an example.

Actually, the number of C2 sectors is set to derive a given redundancy with the sectors in the ECC block that is completed with one or more tracks in the respective zones. Placement of such C2 sectors is also dependent on the number of servo frames.

For example, in an exemplary case where an ECC block is completed with a track and is divided into about 1000 sectors per track, and a track has 96 servo areas, at least the head sector in all of the 96 servo frames on the track may be regarded as a C2 sector.

Even with such redundancy or the number of servo frames, the C2 sector may be plurally placed in the servo frames in the vicinity of the head servo frame. As described in the foregoing, at least, it is considered preferable to place the C2 sectors in the servo frames in the vicinity of the servo frame from which reading is started after on-track, or in any places where errors often occur, i.e., head sector in the servo frame, the sector subsequent to the head sector, the tail sector, or the like.

6. ECC Block Setting for Relative Address Access

By referring to FIGS. 19 to 21, described next is a case where a track-basis access method using relative addresses is adopted.

Figure 19:
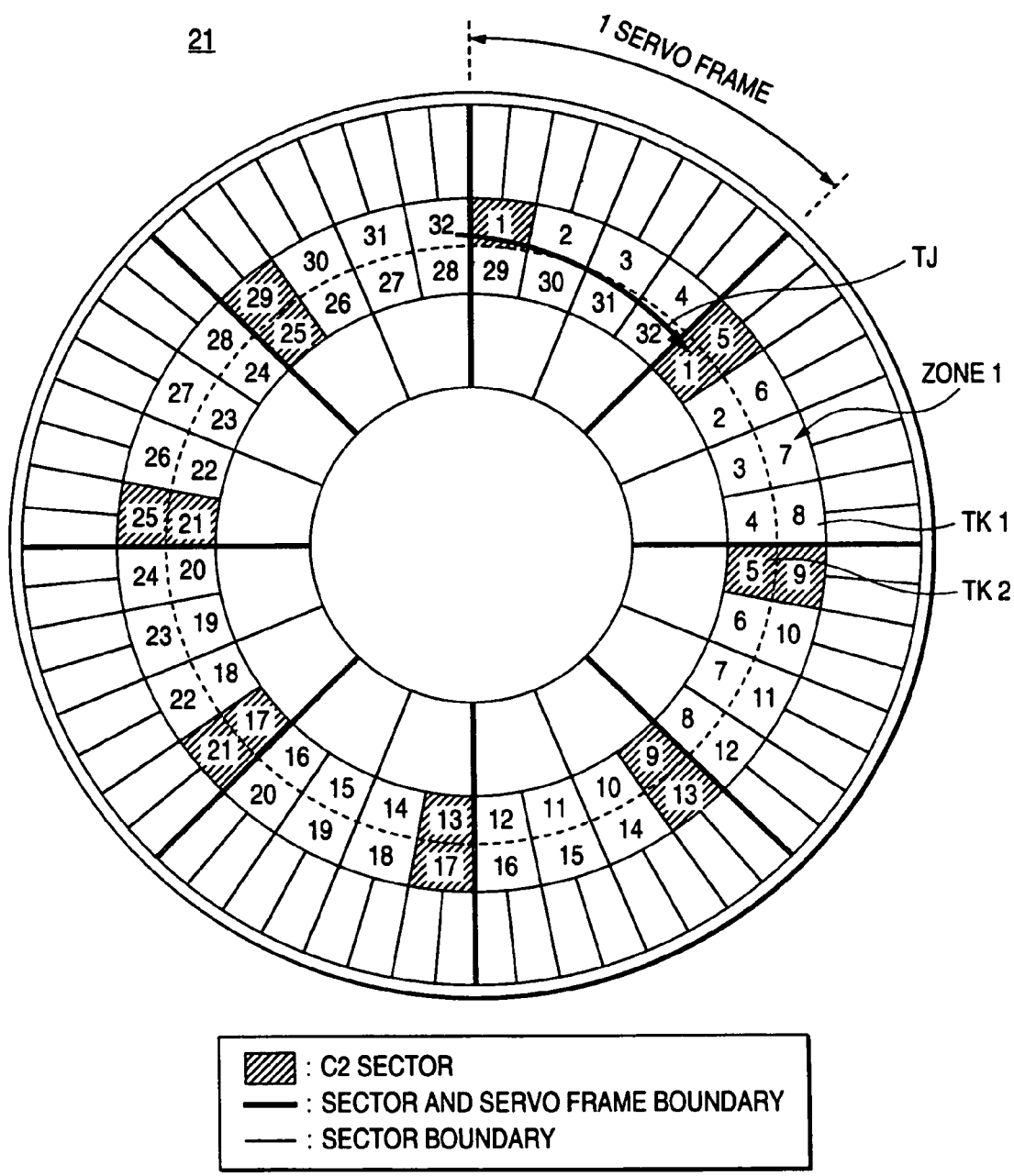
FIG. 19 is a diagram illustrating exemplary C2 sector placement under relative address access of the embodiment.

FIG. 19 shows detailed sector placement. In such a case, an access unit is a track, and as already described, the sectors are each assigned its relative address.

Similarly to FIG. 12 example, FIG. 19 schematically shows the sector placement in 2 tracks in the zone 1. Each track in the zone 1 has 32 sectors, each track is formed with 8 servo frames, and a servo frame in the zone 1 includes 4 sectors.

In this example, a track is of the ECC block structure, and out of 32 sectors per track in the zone 1, 24 sectors are data sectors, and 8 sectors are C2 sectors.

As shown in the drawing, any specific 2 tracks (TK1 and TK2) in the zone 1 are assigned relative addresses from "1" to "32". Here, these relative addresses "1" to "32" are those assigned to the tracks in sequence at a write access, and are not fixedly assigned to the physical positions of the sectors on the track.

The sector in the track TK1 having the relative address of "1" is a sector that becomes first accessible for a write access after a seek operation is through to the track TK1.

Assuming that data writing is made successively to the tracks TK1 and TK2, in the track TK1 of the zone 1, the sectors are assigned relative addresses of "1" to "32", and in the next track TK2, the sectors are also assigned the relative addresses of "1" to "32. In such a case, the position displacement between the head sectors "1" of the tracks TK1 and TK2 is a displacement before an access after a seek operation (track jump TJ) is made from the track TK1 to TK2. This is not necessarily the same as the above-described track skew that is defined by information including the rotation speed, the servo area, or others.

A write access in accordance with the relative addresses is first made from the relative addresses "1" to "32" in the track TK1 of FIG. 19, and then the relative addresses "1" to "32" after the track TK2 is through with a seek operation.

In this example, in FIG. 19, the track TK1 has the C2 sectors having the relative addresses of "1", "5", "9", "13", "17", "21", "25", and "29", and the next track TK2 has the C2 sectors having the relative addresses of "1", "5", "9", "13", "17", "21", "25", and "29".

Such placement examples are equivalent to recording/reproduction in the ECC block structure of FIG. 9, in which the C2 sectors are placed in the ECC block at their given positions including the head sector. FIG. 20 shows such a state.

Figure 20:
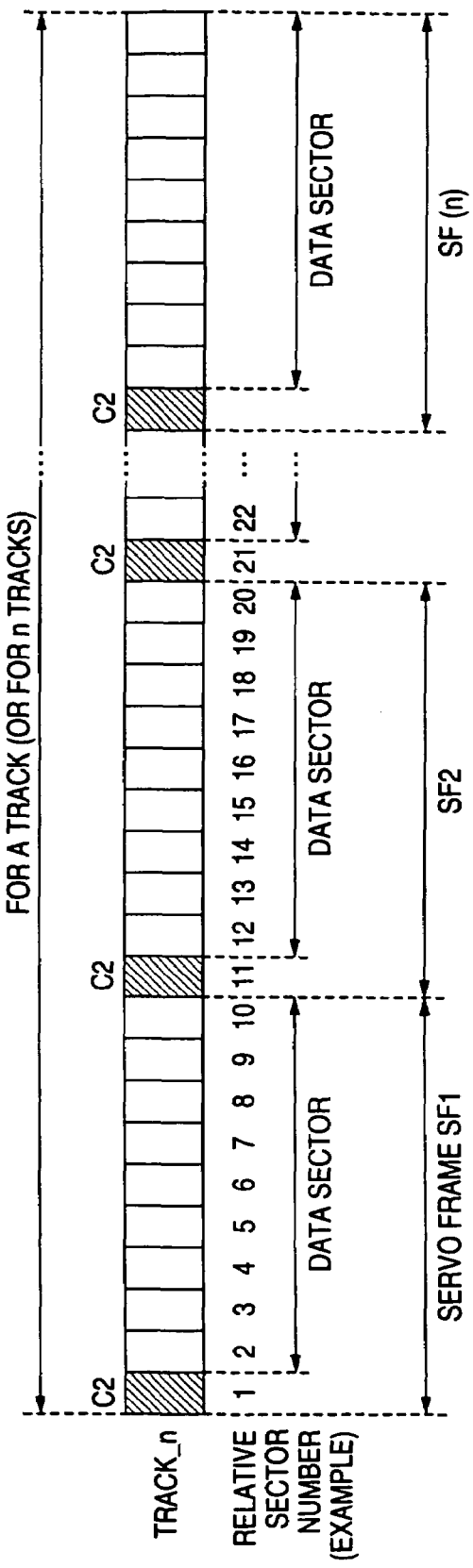
FIG. 20 is a diagram illustrating still another exemplary ECC block structure of the embodiment.

FIG. 20 shows a sector structuring an ECC block for a track, for example. Unlike FIG. 19 example in which a servo frame includes 4 sectors, exemplified in FIG. 20 is a case where a servo frame includes 10 sectors.

As shown in the drawings, ECC block formation is carried out in such a manner that the head sector of the servo frames SF1, SF2, and others having the relative addresses of "1", "11", "21" and others are C2 sectors. After such ECC block formation, and after data writing is made sequentially to the tracks TK1 and TK2, the head sector of the servo frame of the respective tracks will be all a C2 sector.

That is, by forming an error correction block for data writing in such a manner that at least the head sector is a C2 sector in every servo frame, at a read access, the sector from which the data reading is started will be a C2 sector being a redundant part.

In more detail, by placing a C2 sector and (n−1) data sectors in accordance with the number of sectors n in the servo frame, the head sector in the servo frame will be always a C2 sector.

As described in the foregoing, no matter where the on-track position derived by a seek operation, the relative address access can advantageously eliminate rotational delay by performing write or read access from the position.

In other words, the head servo frame immediately after a seek operation is not unchangeable as with the LBA access. That is, any servo frame on the track can serve as a "head servo frame" from which a read access is started immediately after a seek operation is through.

If this is the case, with the fact that every servo frame can be the "head servo frame", as shown in FIG. 19, it is understood that structuring the head sector as a C2 sector in every servo frame is considered preferable.

This allows, at a read access, to start a read access from the C2 sector immediately after on-track, favorably leading to less-affected data output for any error-including sectors that have been output without recovery.

Specifically, the reason for more stable data reproduction is the same as that described with LBA access in the above.

Moreover, as described with the relative access method, eliminating the rotational delay is advantageous in terms of transfer rate.

As FIG. 19, providing a track with 32 sectors including 8 C2 sectors is an exemplary case.

Actually, the number of C2 sectors is set to derive a given level of redundancy with the sectors in the ECC block that is completed with one or more tracks. Placement of such C2 sectors is also dependent on the number of servo frames.

For example, in an exemplary case where an ECC block is completed with a track and is divided into about 1000 sectors per track, and a track has 96 servo areas, at least the head sector in all of the 96 servo frames on the track may be a C2 sector.

In the entire or partial servo frames, surely, the head sector and its subsequent sector may be both a C2 sector, or the head and tail sectors may be a C2 sector.

For example, if a consideration is given to such a seek time difference resulted from disturbances such as vibrations, it is considered preferable if the given number of servo frames subsequent to the head sector in the servo frame are all replaced with a C2 sector.

Moreover, if a consideration is given to the fact that errors often occur in the sector at the tail in the servo frame, it is considered effective if the head and tail sector are both replaced with a C2 sector in the servo frame.

Figure 21:
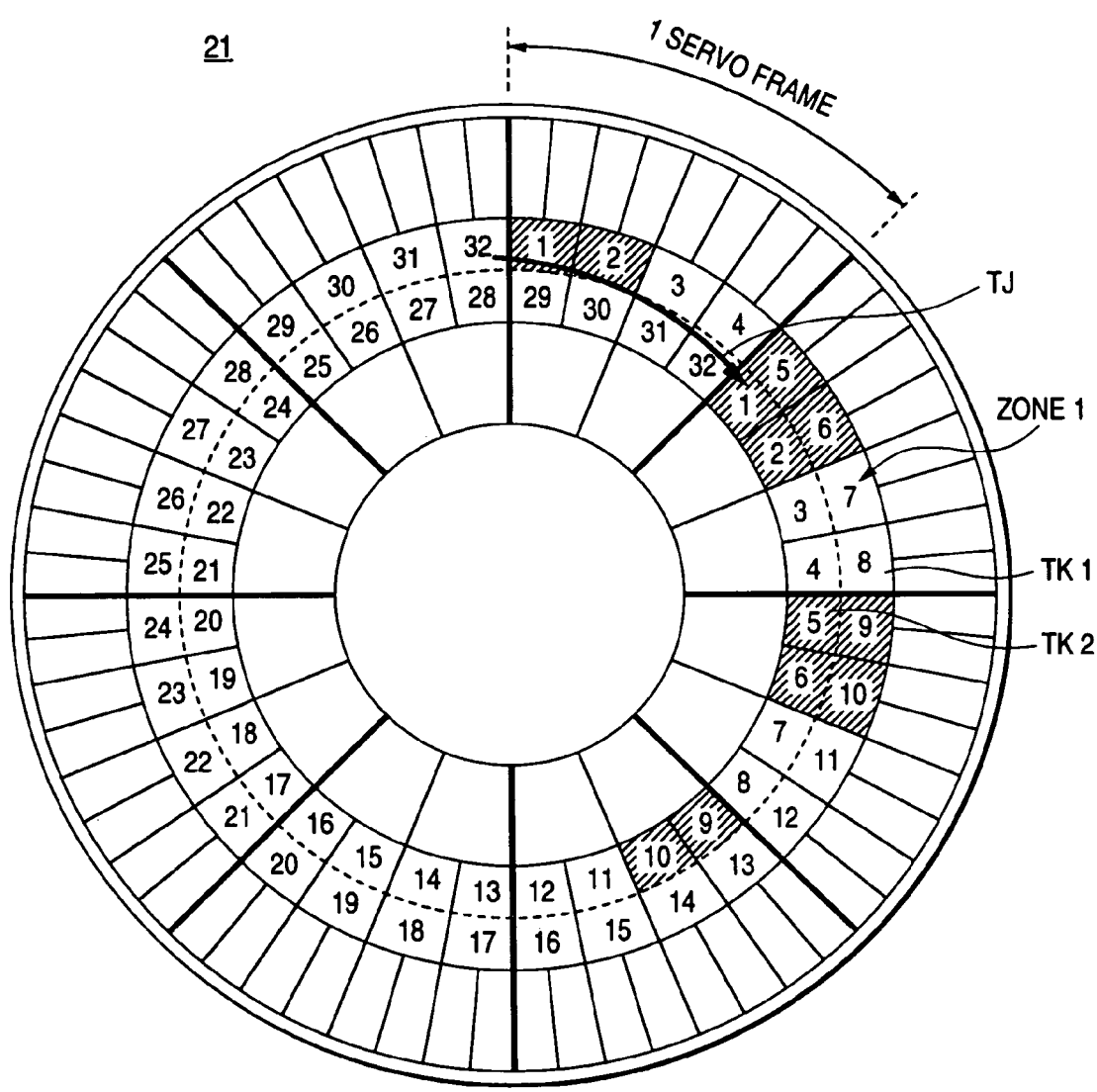
FIG. 21 is a diagram illustrating another exemplary C2 sector placement under the relative address access of the embodiment.

With the relative address access, considered may be a case where a C2 sector is provided to not entire but partial servo frames in a track as FIG. 21 example. If this is the case, the following circumstances become an issue.

With the relative address access, there is no clue which servo frame will be the above-described "head servo frame". If this is the case, if only the partial servo frames are provided with the C2 sector, the sector immediately after on-track at data reading is not always a C2 sector.

Thus, in a case where only the partial servo frames are provided with the C2 sector, when a plurality of tracks are subjected to data writing by write accesses successively made at one time, there needs to exercise an operation control in such a manner that the sector from which the reading is started immediately after on-track is a C2 sector for the second track (track TK2 in this example) and thereafter out of those plurally provided.

As described in the foregoing, with the relative address access, any sector is available for data writing/reading on a track. The relative address allocation is performed from any writable sector, and in this sense, every sector is available for writing. At data reading, the read sector data of a track is rearranged on the buffer RAM 14 based on the relative addresses, and thus any sector is available for reading.

That is, any sector in the track is available for access. Thus, by performing data reading/writing from any arbitrary head position immediately after a seek operation, the rotational delay can be eliminated as described above.

This means that, at data reading, there is no need to start data reading from the sector having the relative address of "1".

Considered here is an exemplary case where the C2 sectors are the sectors having the relative addresses of "1", "2", "5", "6", "9", and "10" as shown in FIG. 21.

Exemplified first is a case where a seek operation is done to the track TK1 of FIG. 21. After on-track, no matter what relative address the readable sector has, a read access may be started from the sector for a track. For example, when the head position immediately after a seek operation is located at the sector having the relative address of "17", accesses may be made to the sectors in sequence having the relative addresses of "17", "18", . . . "32", "1", "2", . . . and "16". This successfully eliminates the rotational delay.

If the same is applicable, as to the next track TK2, a seek operation may be made immediately after the sector "16" is read out. However, with this being the case, the track TK2 on-tracks in the vicinity of the sector "17", i.e., the first sector immediately after on-track will not become a C2 sector (any one of the sectors "1", "2", "5", "6", "9", and "10"). As a result, no such effects as described above can be achieved against the disturbances.

In consideration thereof, two manners are to be possible after the rotational delay if needed for the first track. That is, in the first manner, a read access is started from the sector having the relative address of "1", or in the second manner, a read access is first made for a track, and when the sector having the relative address of "32" comes, a seek operation is done to the next track.

When the first manner is adopted and when a read access is started from the sector having the relative address of "1", a seek operation is first done to the on-track TK1 for any required length of rotational delay, and data reading is started when the sector having the relative address of "1" comes. In such a manner, by doing a seek operation to the next track TK2 when the sectors having the relative addresses of "1" to "32" in a track are through with data reading, also in the track TK2, data reading can be started in the vicinity of the sector having the relative address of "1". Therefore, the first sector immediately after the seek operation is a C2 sector.

Although not shown in FIG. 21, the first sector immediately after the seek operation becomes the C2 sector similarly to the case where track reading is done successively from the tracks TK3, TK4, and others.

In such a case, the tracks TK3, TK4, and others are those having been through with a write access in a sequential manner from the track TK1. With the relative address access method, data writing may be started from any arbitrary sector immediately after the seek operation. However, if the track is the one having been through with writing by successive write accesses, as the tracks TK1 and TK2, the head sector "1" shows a displacement as a result of a seek operation (track jump TJ). It means if the seek operation is made immediately after the sector "32", the next track becomes available from the area closer to the sector "1".

When adopted is the second manner in which a read access is first made for a track, and when the sector having the relative address of "32" comes, a seek operation is done to the next track, and a data reading is made for a track without rotational delay immediately after the on-track after the seek operation to the track TK1, for example. Then, after such data reading for a track, the rotational delay is made as required, and when the sector having the relative address of "32" comes, a seek operation is done to the next track TK2. In this case, in the track TK2, data reading is started in the vicinity of the sector having the relative address of "1". Thus, the sector immediately after the seek operation becomes a C2 sector. Thereafter, in the track TK2, after the sectors having the relative addresses of "1" to "32" are subjected to data reading, a seek operation is done to the next track TK3. As such, the same is applicable also to the track TK3.

As described in the foregoing, to place the C2 sectors to a part of the servo frames when the relative address access is adopted, data reading may be started from the sector having the relative address of "1" only for the first track, or after a track is subjected to data reading, a seek operation may be done after the sector of the relative address of "32" comes. In this manner, data reading is started from the C2 sector immediately after the seek operation in the tracks subsequent to the track TK2.

Herein, the first track means the track that is placed at the head when the given number of tracks are regarded as a unit. For example, as a unit, the given number of tracks are to be successive in number at data recording/reproduction, and has the uniform track skew by a seek operation.

With this being the case, such an advantage of the relative address access that the rotational delay is eliminated at data reading is partially lost, but the rotational delay is still favorably eliminated at a write access. Assuming that the tracks TK1 and TK2 are subjected to data writing, the LBA access requires rotational delay when the track TK1 is on-track. With the relative address access, on the other hand, data writing can be started by regarding any arbitrary sector as having the relative address of "1" immediately after on-track to the track TK1.

Note here that FIGS. 19 and 21 show the examples that the ECC block structure is a track. This is not surely restrictive, and the ECC block structure may be of an n-track basis.

7. Read Process

As described in the foregoing, the HDD 10 of the present embodiment forms an ECC block for placement in such a manner that any sectors in the servo frame firstly carrying out data reading immediately after a seek operation for a track, i.e., any sectors in which errors are easy to occur due to disturbances, become C2 sectors. Thereby, even if C2-uncorrectable errors occur under the state that no recovery exemplarily by a retry operation is available, data loss is reduced. Consequently, data reproduction can be carried out in a more stable manner.

Such an advantage is described next together with a read process.

Figure 22:
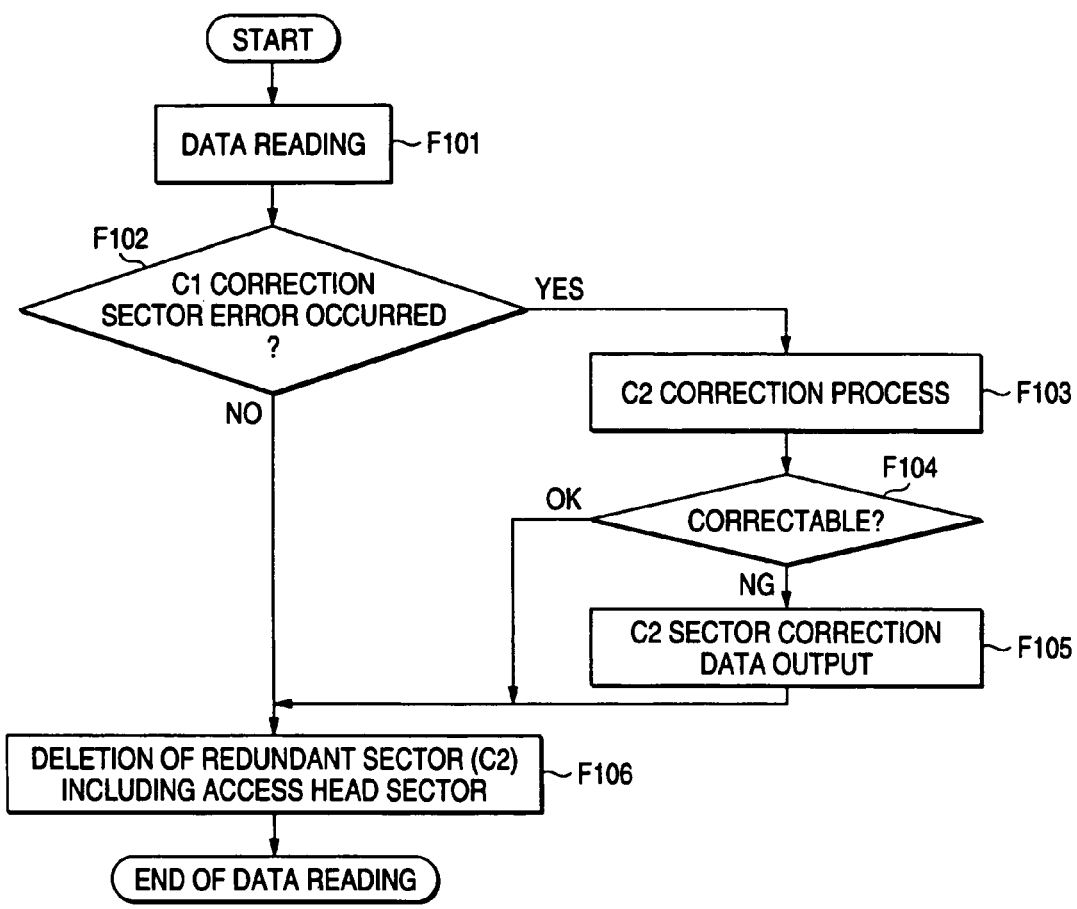
FIG. 22 is a flowchart of a reproduction process of the embodiment.

FIG. 22 shows a flow of an error sector correction process at data reading.

First in step F101, a data read process is carried out. As a result, the given number of sectors are read for storage into the buffer RAM 14. In a case where C2 sectors are placed only a part of the servo frames on the track with the relative address access, the first track for the read process is required to be applied with the above-described control of (1) or (2).

In the next step F102, the disk controller 13 acquires from the buffer RAM 14 the sector data on an ECC block basis, and checks whether the sectors has any sector errors by going through a C1 correction in a sector, for example.

When no sector error is found, the C1-corrected data is put back onto the buffer RAM 14. In Step F106, any redundant part, i.e., the C2 sectors are removed from the ECC-block-basis sectors on the buffer RAM 14, and any need data sectors are extracted. This is the end of the data read process. In more detail, the sector data including no C2 sector on the buffer RAM 14 is output from the interface 17 via the host controller 32. The output read data is correct data having no error.

When any sector error is detected as occurring in step F102, on the other hand, the procedure goes to step F103 for a C2 correction process.

When the C2 sector is sector-correctable, the procedure goes from step F104 to F105, and the read data extracted from the buffer RAM 14 is subjected to the C2 correction process so that the properly-corrected data is acquired. Thus corrected data is then written onto the buffer RAM 14.

Thereafter, in step F106, any redundant sector part, i.e., the C2 sectors are removed from the ECC-block-basis data, and any need data sectors are extracted for output. This is the end of the data read process. Also in this case, the output read data is correct data having no error.

When step F104 determines that no C2 correction is available, no sector error correction process is executed. In this case, the disk controller 13 sends the data extracted from the buffer RAM 14 for error correction back to the buffer RAM 14 as it is. In Step F106, any C2 sectors being the redundant sector are removed from the not-corrected ECC-block-basis data for output. This is the end of the data read process. In this case, the output read data may include errors.

As is understood from the description made referring to FIGS. 11 to 15, it is highly possible that the error-occurring sectors are the C2 sectors. Accordingly, even if no error correction is applicable, the error sectors may possibly be removed by the time when step F106 is executed for output after the C2 sectors are removed. Thus, comprehensively, even if C2 correction is not applicable, the data loss due to the uncorrectable error can be reduced.

8. Application Example

The present invention is not restrictive to the above examples, and surely applicable to various types of cases as follows:

Exemplified above is the case where the HDD 10 carries two of the magnetic disk 21. The present invention is also applicable to a case where the HDD 10 carries one, or three or more magnetic disks 21. The disk 21 may have front and back sides both being recordable. The number of the magnetic head 22 may vary, but this does not hinder the application possibilities of the present invention.

Although the disk 21 is often unremovably incorporated in HDDs, the disk 21 may be removable in HDDs. The present invention is still applicable to such cases.

Further, the present invention is applicable also in disk systems other than the HDDs, e.g., optical disk recording/reproducing system, and magneto-optical disk recording/reproducing system.

Still further, as to the C2 sector placement, the servo frame locating at the head immediately after on-track with a seek operation done, the head sector is not necessarily be a C2 sector. Here, placing the C2 sector in the servo frame itself is considered effective. This is because the adverse effects by disturbances are easily observed in the sectors of the head servo frame.

Still further, exemplified above are basically the servo frame structure as FIG. 5A, i.e., a servo frame carries a plurality of sectors. However, the present invention is surely applicable to the servo frame structure in which the sectors are not provided in integral multiple as FIG. 5B.

For example, the sector numbered 9 in FIG. 5B is split into sectors 9-1 and 9-2, and recorded across two servo frames. Here, if the servo frame carrying the sectors 9-2, 10, and others has the C2 sector at its head, the sector 9-2 is the head sector. Thus, the sector 9, i.e., sectors 9-1 and 9-2, is the C2 sector. If this is the case, even if the head sector is the C2 sector, the head sector and the tail sector immediately before the head sector will be both the C2 sectors, and schematically, it is similar to FIG. 14 example. Surely in such a case, the same effects as described above can be derived.

The program of the present invention is a program implementing the capabilities of the HDD 10. Especially by the program activated by the CPU 11, and by the components of the HDD 10 controlled by the program, a process of implementing the ECC block structure described by referring to FIGS. 18 and 20 is executed.

Such a program may be previously recorded on the ROM/ RAM 12, for example, or may be recorded on the magnetic disk 21 for loading onto the ROM/RAM 12.

According to the present invention, provided are data recording/reproducing system and method, a program, and a recording medium those are superior to others, capable of realizing stable data reproduction with good redundancy effects using error correction codes.

In more detail, using a first error correction code unit makes random errors correctable in sectors, and using a second error correction code unit makes errors correctable even if those exceed an error correction range, and burst errors even if those occur across the sectors. Accordingly, even if no retry operation is available to keep a data transfer speed constant or higher, error correction can be properly applied, favorably resulting in more stable system. As such, by eliminating the need for the retry operation with error-correctable random errors and burst errors over a wider range, data reproduction can be performed stably without causing the reduction of the transfer speed.

What is more, in the error correction block structure, a sector having the second error correction code (C2 sector) is set to be located in the servo frame from which data reading is started-when a seek operation reaches the C2 sector in a specific track. With such a setting, an access to be made immediately after the seek operation will be started from the servo frame including the C2 sector. For example, having the C2 sector at the head of the servo frame will start an access from the C2 sector. Accordingly, the C2 sector can be placed at where errors easily occur due to disturbances, thereby successfully minimizing the adverse effects to be caused by the disturbances on the data sectors, and realizing stable data reproduction. More specifically, even if the ECC correction capability is not set enough and thus errors occur, it is highly possible that errors occur to the C2 sectors. As such, any data loss to be caused by the errors can be effectively reduced.

Moreover, the C2 sectors may be placed not only in the head servo frame but also in its preceding and subsequent servo frames, or every servo frame is provided with a C2 sector. With this being the case, as a measure taken for a case where unexpected accidents occur, the same effects as above can be derived no matter if the seek position is changed.

For placing the C2 sectors in the head servo frame or any other servo frames, there needs to make sure that at least the head sector is the C2 sector to derive most effective effects. This is because the head sector in the servo frame often suffers errors.

The sectors plurally following the head sector are to be the C2 sectors so as to derive effectiveness for a case where disturbances are high in level and thus error sectors appear in sequence.

Furthermore, according to the present invention, an access is started from the first accessible sector on a track having been though with a seek operation for a write access for a track. This makes a track an access unit, and implemented thereby is data write access control causing no rotational delay. In other words, the data access time can be favorably shortened.

Also in such an access method, any adverse effects by disturbances can be minimized if the head position immediately after the seek operation is in the C2 sector. That is, stable reading can be achieved at a read access. Especially, in this case, no servo frame can be designated for starting an access, and thus in every servo frame, it is considered effective that the head sector is the C2 sector.

What is claimed is:

1. A data recording/reproducing system for a disk recording medium in which tracks are concentrically formed and each having a plurality of sectors, servo regions are radially oriented at predetermined positions on each of the tracks, and servo frames are formed on the tracks with the sectors placed between the servo regions, the system comprising:

seek means for seeking a target track;

data access means for making an access on the found track; and error correction means for generating an error correction code for data error correction, and carrying out the data error correction based on the error correction code, wherein the error correction means sets a first error correction code unit to a given amount of data, sets a second error correction code unit that is corresponding to two or more of the first error correction code units, forms an error correction block including two or more of the first error correction code units and the second error correction code unit provided thereto, and generates the error correction block so that at least one of the sectors each provided with the second error correction code unit is located in the servo frame at a head sector from which the data access means first starts reading when the seek means moves onto a specific track of the recording medium.

2. The data recording/reproducing system according to claim 1, wherein the error correction means forms the error correction block in which the sector provided with the second error correction code unit is plurally placed so that two or more of the servo frames preceding or subsequent to the head servo frame on the track also include the sector provided with the second error correction code unit.

3. The data recording/reproducing system according to claim 1, wherein the error correction means forms the error correction block in which the sector provided with the second error correction code unit is plurally provided so that all of the servo frames on the track also include the sector provided with the second error correction code unit.

4. The data recording/reproducing system according to claim 1, wherein the error correction means forms the error correction block so that at least the sector locating at the head in the servo frame is the sector provided with the second error correction code unit.

5. The data recording/reproducing system according to claim 1, wherein the error correction means forms the error correction block so that two or more of the sectors in sequence from the head sector in the servo frame is the sector provided with the second error correction code unit.

6. The data recording/reproducing system according to claim 1, wherein the error correction means forms the error correction block so that the head sector and a tail sector in the servo frame are the sectors each provided with the second error correction code unit.

7. The data recording/reproducing system according to claim 1, wherein the error correction means forms the error correction block so that the sector provided with the second error correction code unit is located at the head at least in the error correction block.

8. The data recording/reproducing system according to claim 1, wherein the error correction means forms the error correction block so that the sector provided with the second error correction code unit is plurally placed in the error correction block.

9. The data recording/reproducing system according to claim 1, wherein the error correction means forms the error correction block so that the error correction block is completed with one or more tracks.

10. The data recording/reproducing system according to claim 1, wherein the error correction means forms the error correction code with Reed-Solomon.

11. The data recording/reproducing system according to claim 1, wherein the error correction block to be formed by the error correction means has an interleave structure in the first or second error correction code unit.

12. The data recording/reproducing system according to claim 1, wherein the data access means makes an access to the whole track found by the seek means, starting a write access from the sector whichever becomes accessible first.

13. The data recording/reproducing system according to claim 12, wherein the data access means reproduces written data by sequentially allocating, a relative position address to the sectors specifically from the firstly-accessed on the track, and at a read access, by rearranging, at a read access, the data read from the sectors on the track in accordance with the relative position addresses.

14. The data recording/reproducing system according to claim 12, wherein the error correction means forms the error correction block so that none of the tracks has two or more of the error correction blocks, and the error correction block is completed with one or more tracks.

15. A data recording/reproducing method for a disk recording medium in which tracks are concentrically formed and each having a plurality of sectors, servo regions are radially oriented at predetermined positions on each of the tracks, and servo frames are formed on the tracks with the sectors placed between the servo regions, the method comprising:
    seeking a target track;
    accessing the found track; and
    generating an error correction code for data error correction, and carrying out the data error correction based on the error correction code, wherein the generating an error correction code sets a first error correction code unit to a given amount of data, sets a second error correction code unit that is corresponding to two or more of the first error correction code units, forms an error correction block including two or more of the first error correction code units and the second error correction code unit provided thereto, and generates the error correction block so that at least one of the sectors each provided with the second error correction code unit is located in the servo frame at a head sector from which the accessing the found track first starts reading when the seeking a target track reaches a specific track of the recording medium.

16. A computer readable storage medium encoded with a computer readable program for executing on a computer system a data recording/reproducing process with respect to a disk recording medium in which tracks are concentrically formed and each having a plurality of sectors, servo regions are radially oriented at predetermined positions on each of the tracks, and servo frames are formed on the tracks with the sectors placed between the servo regions, configured to cause an information processing apparatus to execute a method, the method comprising:
    seeking a target track;
    accessing the found track; and
    generating an error correction code for data error correction, and carrying out the data error correction based on the error correction code; and
    storing in a memory the error correction code for data error correction, wherein
    the generating an error correction code sets a first error correction code unit to a given amount of data, sets a second error correction code unit that is corresponding to two or more of the first error correction code units, and form an error correction block including two or more of the first error correction code units and the second error correction code unit provided thereto, and generates the error correction block so that at least one of the sectors each provided with the second error correction code unit is located in the servo frame at a head sector from which the accessing the found track first starts reading when the seeking a target track reaches a specific track of the recording medium.

\* \* \* \* \*